US011929293B2

(12) United States Patent
Lin et al.

(10) Patent No.: US 11,929,293 B2
(45) Date of Patent: Mar. 12, 2024

(54) SEMICONDUCTOR PACKAGE WITH LID STRUCTURE

(71) Applicant: Taiwan Semiconductor Manufacturing Company, Ltd., Hsinchu (TW)

(72) Inventors: Tsung-Shu Lin, New Taipei (TW); Wensen Hung, Hsinchu County (TW); Tsung-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 159 days.

(21) Appl. No.: 17/406,108

(22) Filed: Aug. 19, 2021

(65) Prior Publication Data

US 2023/0059983 A1 Feb. 23, 2023

(51) Int. Cl.
*H01L 23/053* (2006.01)
*H01L 21/52* (2006.01)
*H01L 25/18* (2023.01)

(52) U.S. Cl.
CPC ............ *H01L 23/053* (2013.01); *H01L 21/52* (2013.01); *H01L 25/18* (2013.01)

(58) Field of Classification Search
CPC ........ H01L 23/053; H01L 21/52; H01L 25/18
USPC ....................................................... 257/704
See application file for complete search history.

(56) References Cited

U.S. PATENT DOCUMENTS

| | | | | |
|---|---|---|---|---|
| 5,977,622 | A | * | 11/1999 | Mertol ................ H01L 23/4093 257/787 |
| 6,049,456 | A | * | 4/2000 | Messina ............... H01L 23/4006 257/713 |
| 8,993,380 | B2 | | 3/2015 | Hou et al. |
| 9,281,254 | B2 | | 3/2016 | Yu et al. |
| 9,299,649 | B2 | | 3/2016 | Chiu et al. |
| 9,372,206 | B2 | | 6/2016 | Wu et al. |
| 9,425,126 | B2 | | 8/2016 | Kuo et al. |
| 9,443,783 | B2 | | 9/2016 | Lin et al. |
| 9,461,018 | B1 | | 10/2016 | Tsai et al. |
| 9,496,189 | B2 | | 11/2016 | Yu et al. |
| 9,666,502 | B2 | | 5/2017 | Chen et al. |
| 9,735,131 | B2 | | 8/2017 | Su et al. |
| 2005/0072972 | A1 | * | 4/2005 | Tashiro ............. H01L 21/67333 257/E23.179 |
| 2011/0018125 | A1 | * | 1/2011 | Loo .......................... H01L 23/16 257/E23.101 |

* cited by examiner

*Primary Examiner* — Quoc D Hoang
(74) *Attorney, Agent, or Firm* — JCIPRNET

(57) ABSTRACT

A semiconductor package includes a substrate, a package structure, and a lid structure. The package structure is disposed on the substrate. The lid structure is disposed over substrate, wherein the lid structure includes a main body covering and surrounding the package structure and a plurality of rib portions protruded from the main body and extended toward the package structure.

20 Claims, 19 Drawing Sheets

SEMICONDUCTOR PACKAGE WITH LID STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
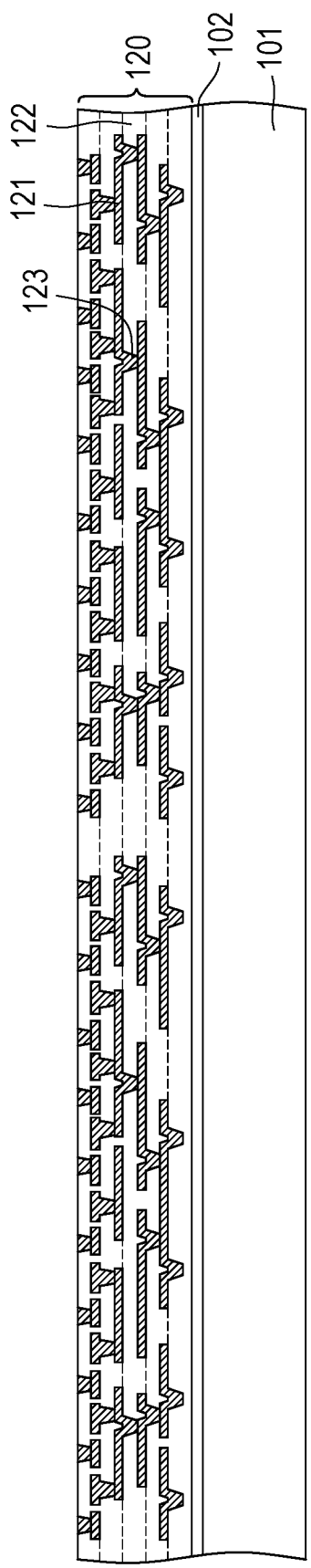
FIG. 1 to FIG. 11 illustrates a cross sectional views of intermediate stages in the manufacturing of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of manufacturing a semiconductor package are provided in accordance with various exemplary embodiments. Before addressing the illustrated embodiments specifically, certain advantageous features and aspects of the present disclosed embodiments will be addressed generally. Described below is a semiconductor package including a package structure bonded to a substrate. In addition, the lid structure is disposed over the substrate and the package structure through a thermal interface layer, wherein the lid structure includes a main body covering and surrounding the package structure and a plurality of rib portions protruded from the main body and extended toward the package structure.

Generally, there may exist coefficient of thermal expansion (CTE) mismatch between the material typically used for the lid structure (e.g., metal), the material typically used for the semiconductor device (e.g., silicon) and the material used for the substrate (e.g., Ajinomoto Build-up Film, ABF, glass fiber). The CTE mismatch between these materials may cause thermal stress on the device dies, which may result in die crack or delamination between the device dies and the thermal interface layer. Accordingly, with the arrangement of the rib portions extended toward the package structure, warpage of the package can be improved, so as to reduce the issues of delamination between the device dies and the thermal interface layer, and the thermal performance of the semiconductor package can be improved. The intermediate stages of forming the semiconductor package are illustrated in accordance with some embodiments. Some variations of some embodiments are discussed. Throughout the various views and illustrative embodiments, like reference numbers are used to designate like elements.

FIG. 1 to FIG. 11 illustrates a cross sectional views of intermediate stages in the manufacturing of a semiconductor package according to some embodiments of the present disclosure. In some embodiments, a package structure 100 shown in FIG. 10 may be provided on a substrate 200. In some embodiments, the package structure 100 may include a plurality of device dies 110 and a filling material 170 fills at least one gap between adjacent two of the device dies 110. FIG. 1 to FIG. 9 illustrates one of the possible methods of manufacturing the package structure 100 shown in FIG. 10. However, the disclosure is not limited thereto. Other suitable packages and component configurations may also be applied. The package structure 100 may be in a wafer form (a reconstructed wafer) in the process. The formation of the package structure 100 may include the following steps.

Referring to FIG. 1, in some embodiments, a redistribution structure 120 described above is formed on a carrier 101. In some embodiments, the carrier 101 includes, for example, silicon based materials, such as glass or silicon oxide, or other materials, such as aluminum oxide, combinations of any of these materials, or the like. The carrier 101 is planar in order to form the redistribution structure 120 thereon and accommodate an attachment of device dies 110 (not illustrated in FIG. 1 but illustrated and described below with respect to FIG. 3). In some embodiments, an adhesive layer 102 may be placed on the carrier 101 in order to assist in the adherence of overlying structures (e.g., the redistribution structure 120). In an embodiment the adhesive layer 102 may include an ultra-violet glue, which loses its adhesive properties when exposed to ultra-violet light. However, other types of adhesives, such as pressure sensitive adhesives, radiation curable adhesives, epoxies, an Ajinomoto build-up film (ABF), combinations of these, or the like, may also be used. The adhesive layer 102 may be placed onto the carrier 101 in a semi-liquid or gel form, which is readily deformable under pressure.

In accordance with some embodiments of the disclosure, the redistribution structure 120 is formed over the carrier 101 and the adhesive layer 102 (if any). In some embodiments, the redistribution structure 120 may be formed by depositing conductive layers, patterning the conductive layers to form a plurality of redistribution lines (e.g., the redistribution lines 121). The redistribution lines are at least partially covered with dielectric layers (e.g., dielectric layer 122) and the dielectric layers fill the gaps between the redistribution lines and the conductive lines. The vias (e.g., the via 123) are located on the layers of the redistribution structure 120 respectively and extending through the corresponding dielectric layers for interconnecting the redistribution lines at different layers. The material of the redistribution lines may include a metal or a metal alloy including aluminum, copper, tungsten, and/or alloys thereof.

In detail, a seed layer, such as a copper, titanium, or the like, may be deposited over the carrier 101, such as by sputtering or another physical vapor deposition (PVD) process. A photo resist is deposited on the seed layer and patterned to expose portions of the seed layer by photolithography. The pattern is for a metallization layer on the redistribution structure 120. Conductive material of the redistribution lines and the conductive lines, such as copper, aluminum, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms a metallization layer (e.g., the redistribution lines) of the redistribution structure 120. A dielectric layer is deposited over the metallization layer. The material of the dielectric layer may include polymer such as a polyimide, polybenzoxazole (PBO), benzocyclobutene (BCB), the like, or a combination thereof. The dielectric layer can be deposited by a coating process, a lamination process, the like, or a combination thereof. Vias may be formed through the dielectric layer to the metallization layer using acceptable photolithography techniques.

Subsequent metallization layers and dielectric layers may be formed using the same or similar processes as discussed. Conductive material deposited during the formation of a subsequent metallization layer may be deposited in openings of the previously formed dielectric layers to form vias for electrically connecting respective metallization layers. After forming the topmost dielectric layer, via is formed through the topmost dielectric layer for connectors coupled between the redistribution lines, and another semiconductor device, package, die, and/or another substrate. It should be noted that any number of metallization layers and dielectric layers may be formed, and the redistribution structure 120 in this embodiment is illustrated as an example.

Figure 2:
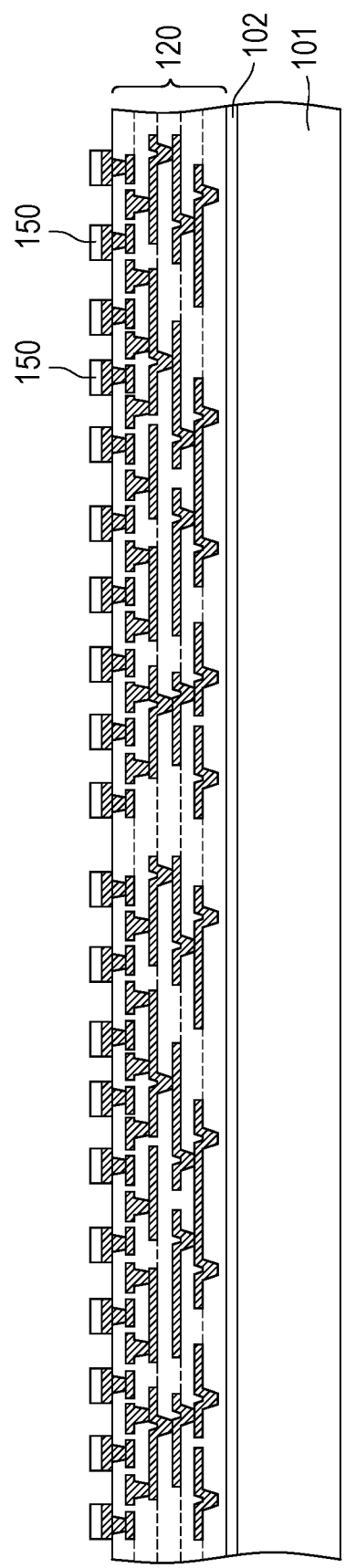

With now reference to FIG. 2, in some embodiments, after the redistribution structure 120 is formed, the conductive bumps 150 are provided over the redistribution structure 120. In some embodiments, the conductive bumps 150 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. In the present embodiment, the conductive bumps are micro bumps, for example, and each of the conductive bumps 150 may include a solder layer formed above a copper seed layer. An optional nickel layer may be in between the solder layer and the copper seed layer. The copper seed layer and the nickel layer may act as an UBM and a barrier layer for the formation of solder layer. The solder layer may include an electrically conductive solder material, e.g., Sn, Ni, Au, Ag, Cu, Bi, W, Fe, Ferrite, an alloy or combination thereof, or any other suitable material. One of ordinary skill in the art will recognize that there are many suitable arrangements of materials and layers suitable for the formation of the conductive bumps 150. Any suitable materials or layers of material that may be used for the conductive bumps 150 are fully intended to be included within the scope of the current embodiments.

Figure 3:
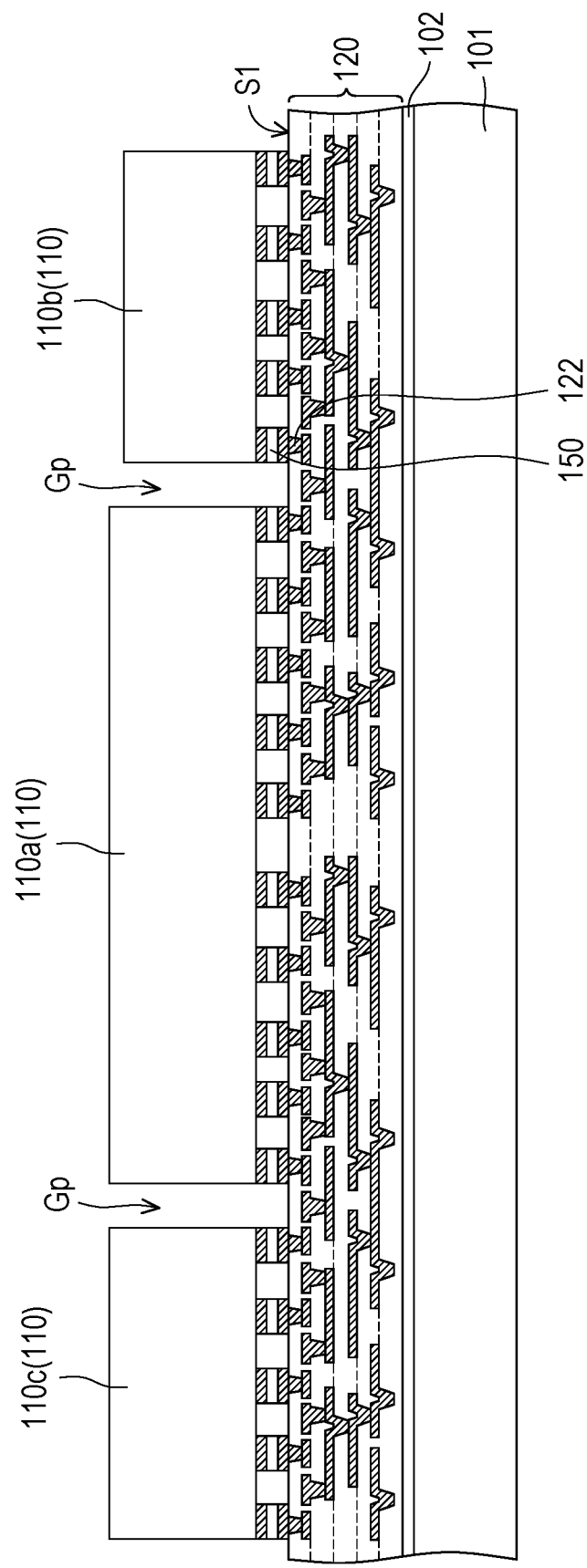

With now reference to FIG. 3, in some embodiments, at least one device die 110 is boned on a first side 51 of the redistribution structure 120, for example, through the conductive bumps 26 by flip-chip bonding technique. In some embodiments, more than one device dies 110 (e.g., device dies 110a, 110b, 110c) may be placed on the conductive bumps 150 using, for example, a pick-and-place tool. In the present embodiment, three device dies 110a, 110b, 110c are illustrated herein, but more or less device dies may be applied to the semiconductor package 10. The disclosure is not limited thereto. The device dies 110 are disposed on the carrier 101 in a side-by-side manner. Accordingly, at least one gap Gp exists between any two adjacent device dies 110. Herein, two gaps Gp are illustrated, but more or less gap may be applied according to the number of the device dies 110. In some embodiments, the device die 110a may be a logic die, such as a system on chip (SOC), a system on integrated chip (SoIC), application specific integrated circuit (ASIC), or the like. The device dies 110b, 110c may be memory dies, such as a DRAM die, SRAM die, or the like. Other types of dies may also be adopted, such power management dies (e.g., power management integrated circuit (PMIC) dies), radio frequency (RF) dies, sensor dies, micro-electro-mechanical-system (MEMS) dies, signal processing dies (e.g., digital signal processing (DSP) die), front-end dies (e.g., analog front-end (AFE) dies), transceiver (TRX) dies, the like, or a combination thereof. In addition, the device dies 110a, 110b, 110c may be in different sizes (e.g., different heights and/or surface areas), and in other embodiments, the device dies 110a, 110b, 110c may be in the same size (e.g., same heights and/or surface areas). In an embodiment, the device dies 110 are bonded to the first side 51 of the redistribution structure 120 by a reflow process. During this reflow process, the conductive bumps 150 are in contact with the device dies 110, and the pads (UBM layer) of the redistribution structure 120 to physically and electrically couple the device dies 110 to the redistribution structure 120.

Figure 4:
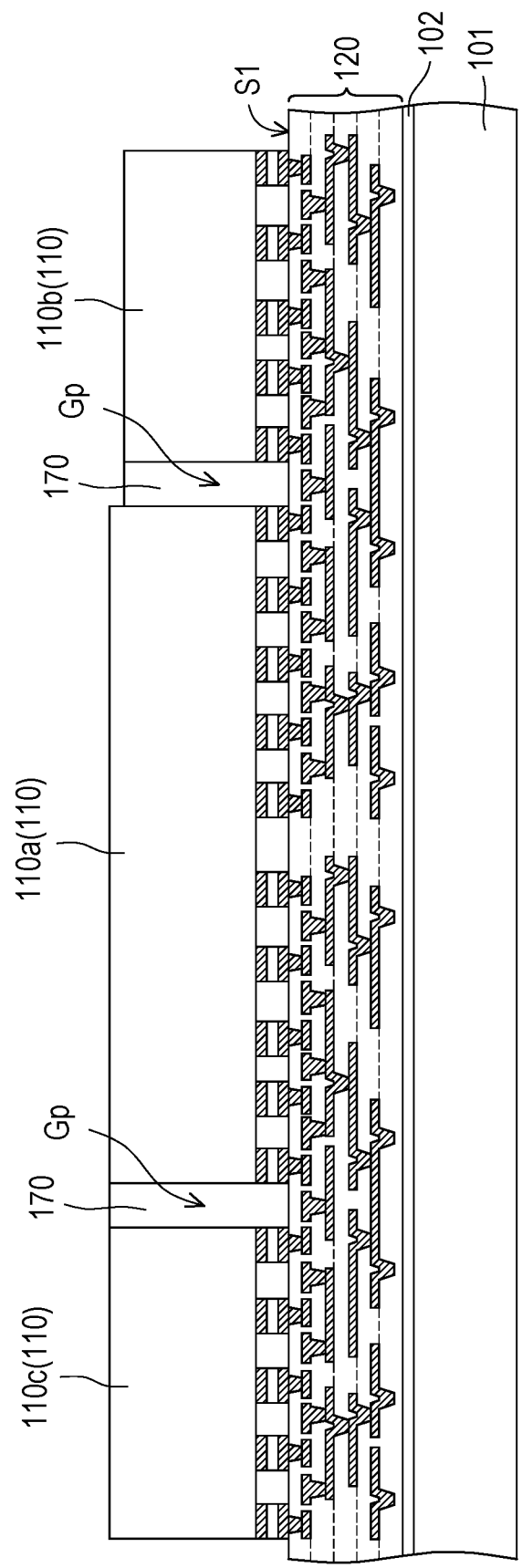

With now reference to FIG. 4, a filling material 170 is provided to at least fill the gaps Gp between the device dies 110. In an embodiment, the filling material 170 is dispensed into the gaps Gp between the device dies 110 and surrounding the conductive bumps 150. Then, a thermal process is performed to set (cure) the filling material 170. In some embodiments, the filling material 170 may extend up along sidewall of the device dies 110. The filling material 170 may be any acceptable material, such as a polymer, epoxy, molding underfill, or the like. In the present embodiment, the filling material includes underfill material, but the disclosure is not limited thereto. The filling material 170 may be formed by a capillary flow process after the device dies 110 are attached, or may be formed by a suitable deposition method before the device dies 110 are attached. In such embodiment, the filling material 170 fills the gaps Gp between the device dies 110, and may partially cover or not cover the outermost side surfaces of the device die 110 as it is shown in FIG. 5.

Figure 6:
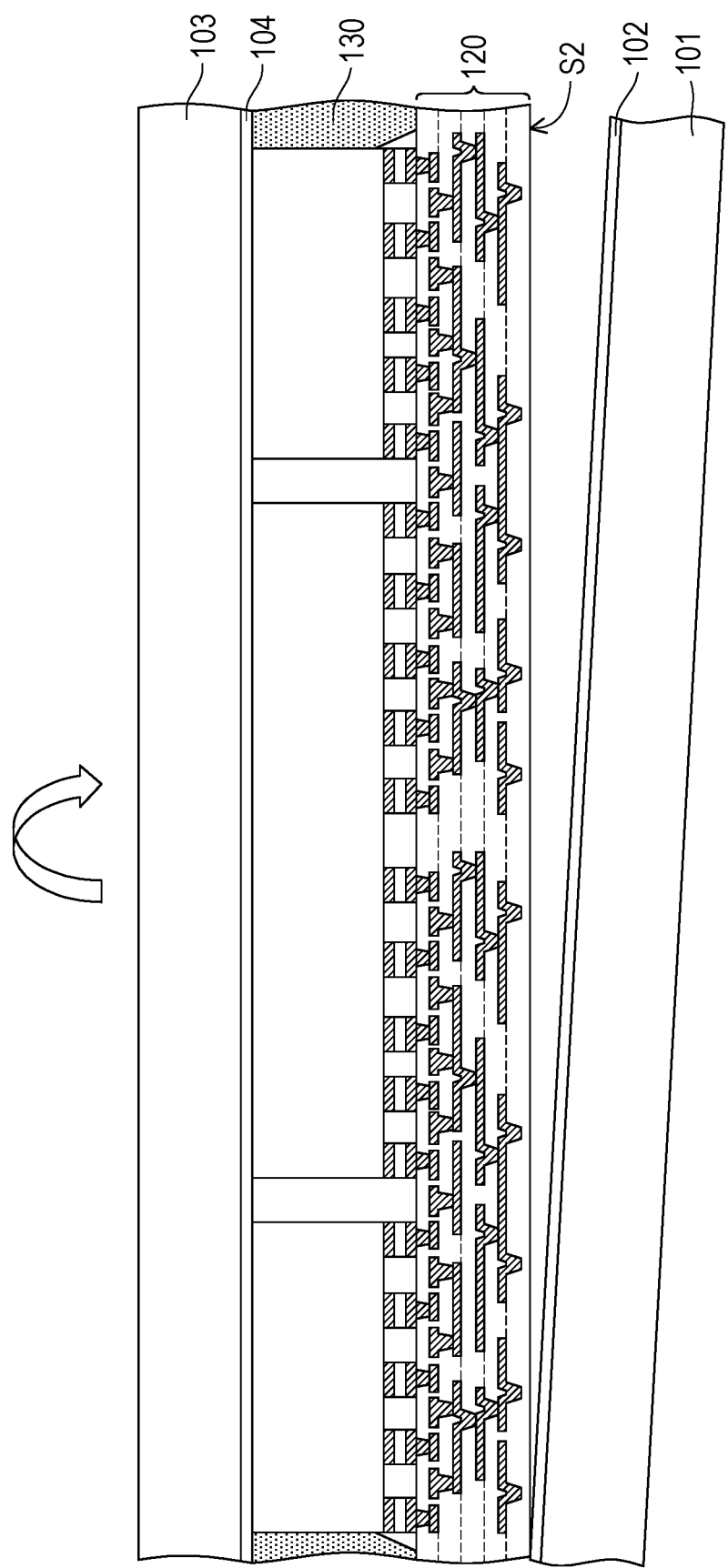

Referring to FIG. 6, an encapsulating material 130 may be optionally provided over the redistribution structure 120 to encapsulate the device dies 110 in accordance with some embodiments. Then, a thermal process is performed to set the encapsulating material 130. The encapsulating material 130 may include a molding compound, an epoxy, or a resin, etc. In some embodiments, a top surface of the encapsulating material 130 may be higher than back surfaces of the device dies 110. Namely, the encapsulating material 130 covers the back surfaces of the device dies 110.

Then, a thinning process, which includes a grinding process, may be performed to thin the encapsulating material 130 (and the filling material 170) until the back surfaces of the device dies 110 are revealed. The resulting structure is shown in FIG. 5. Due to the thinning process, the back surfaces of the device dies 110 are substantially level with the upper surfaces of the filling material 170, and are substantially level with the upper surface of the encapsulating material 130 as shown in FIG. 5. Throughout the description, the resultant structure including the device dies 110, the filling material 170, the encapsulating material 130 (optional), and the redistribution structure 120 as shown in FIG. 5 is referred to as a package wafer PK, which may have a wafer form in the process.

Figure 5:
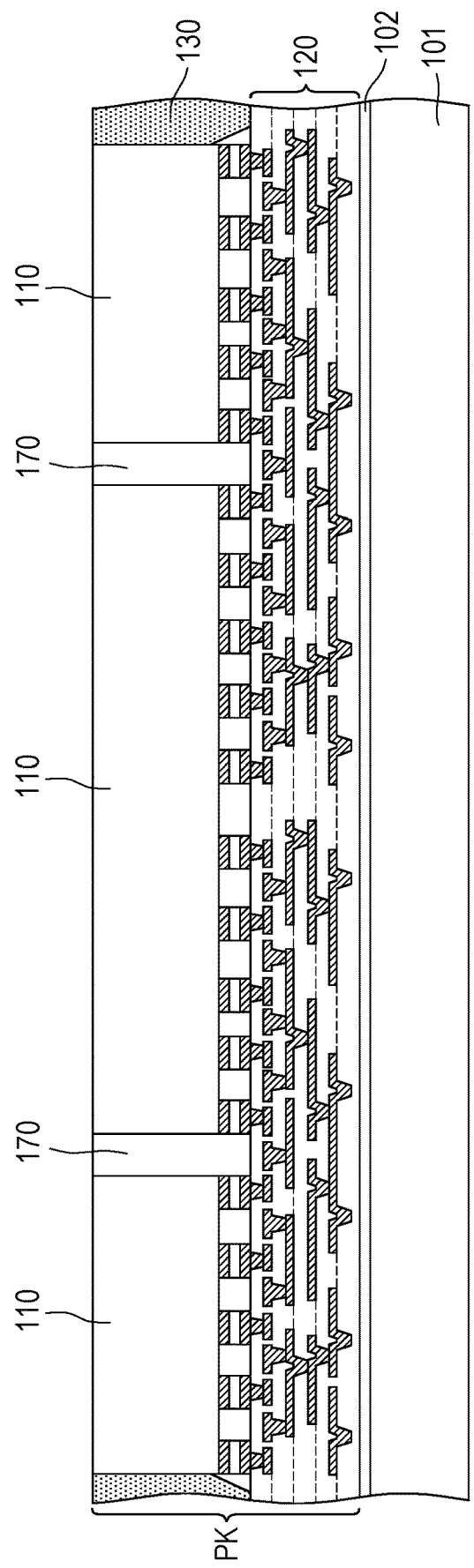

With now reference to FIG. 5 and FIG. 6, an upper side of the package wafer PK is now temporarily attached to another carrier 103 by an adhesive layer 104 for supporting the package wafer PK during subsequent processing. In some embodiments, the carrier 103 may be glass, ceramic, alumina, stainless steel or another material that provides adequate temporary support for the package wafer PK during processing. A demounting step is performed to remove the carrier 101 from a second side S2 of the redistribution structure 120. In some embodiments, the carrier 101 is detached from the second side S2 of the redistribution structure 120 by causing the adhesive layer 102 to lose or reduce adhesion. The adhesive layer 102 is then removed along with the carrier 101. For example, the adhesive layer 102 may be exposed to UV light, so that the adhesive layer 102 loses or reduces adhesion, and hence the carrier 101 and the adhesive layer 102 can be removed from the second side S2 of the redistribution structure 120. It is noted that the orientation in the figures is shown for purposes of illustration only, and the process could be performed with the structure oriented in another direction.

Figure 7:
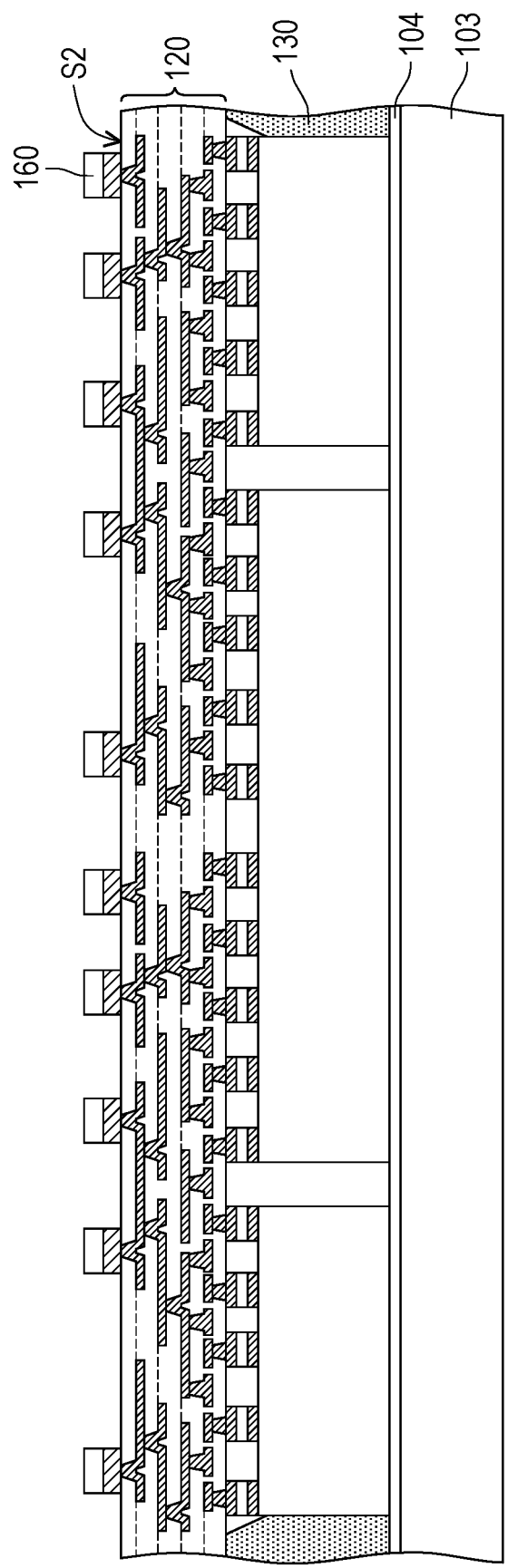

In FIG. 7, the orientation of the package wafer PK is flipped, and the connectors 160 are provided over the second side S2 of the redistribution structure 120. Again, the orientation in the figures is shown for purposes of illustration only, and the process could be performed with the structure oriented in another direction. In some embodiments, the connectors 160 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 160 may include a conductive material such as solder, copper, aluminum, gold, nickel, silver, palladium, tin, the like, or a combination thereof. In some embodiments, the connectors 160 include a eutectic material and may comprise a solder bump or a solder ball, as examples. In some embodiments, a reflow process may be performed, giving the connectors 160 a shape of a partial sphere in some embodiments. Alternatively, the connectors 160 may comprise other shapes. The connectors 160 may also comprise non-spherical conductive connectors, for example. In some embodiments, the connectors 160 include metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls. In the present embodiment, the connectors are C4 bumps, but the disclosure is not limited thereto.

Figure 8:
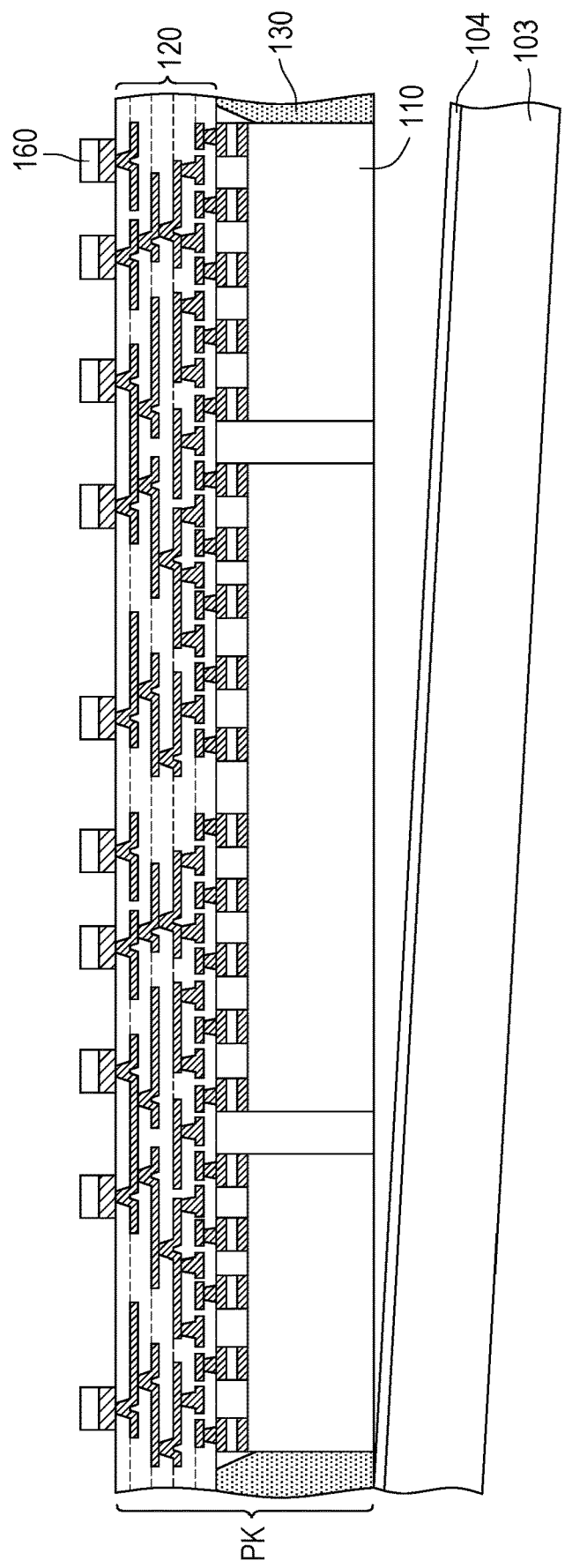

With now reference to FIG. 8, a demounting step is performed to remove the carrier 103 from the package wafer PK. In some embodiments, the carrier 103 is detached from the package wafer PK by causing the adhesive layer 104 to lose or reduce adhesion. The adhesive layer 104 is then removed along with the carrier 103. For example, the adhesive layer 104 may be exposed to UV light, so that the adhesive layer 104 loses or reduces adhesion, and hence the carrier 103 and the adhesive layer 104 can be removed from the package wafer PK.

Figure 9:
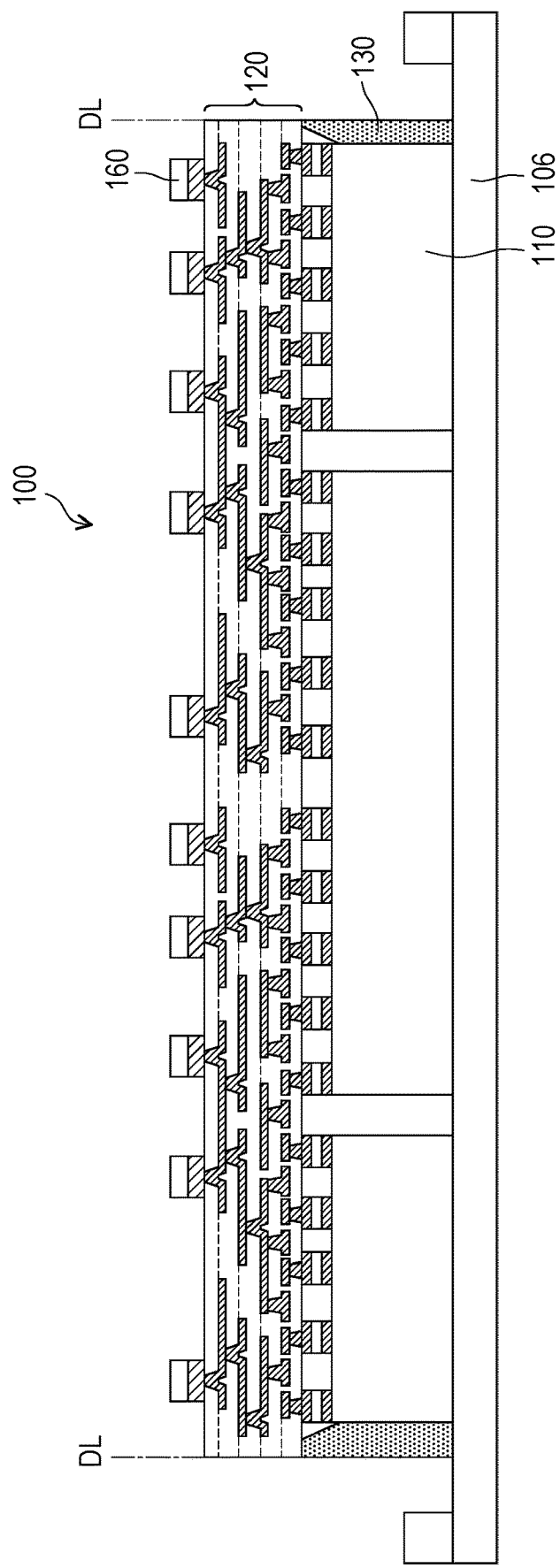

Referring to FIG. 9, the package wafer PK may then be mounted (e.g. frame mounted) onto a dicing tape 106. Following this, package wafer PK may be singulated or diced (e.g. along dicing line DL), thereby forming a plurality of package structures 100, each of which may be substantially identical to the package structure 100 shown in FIG. 10.

Figure 10:
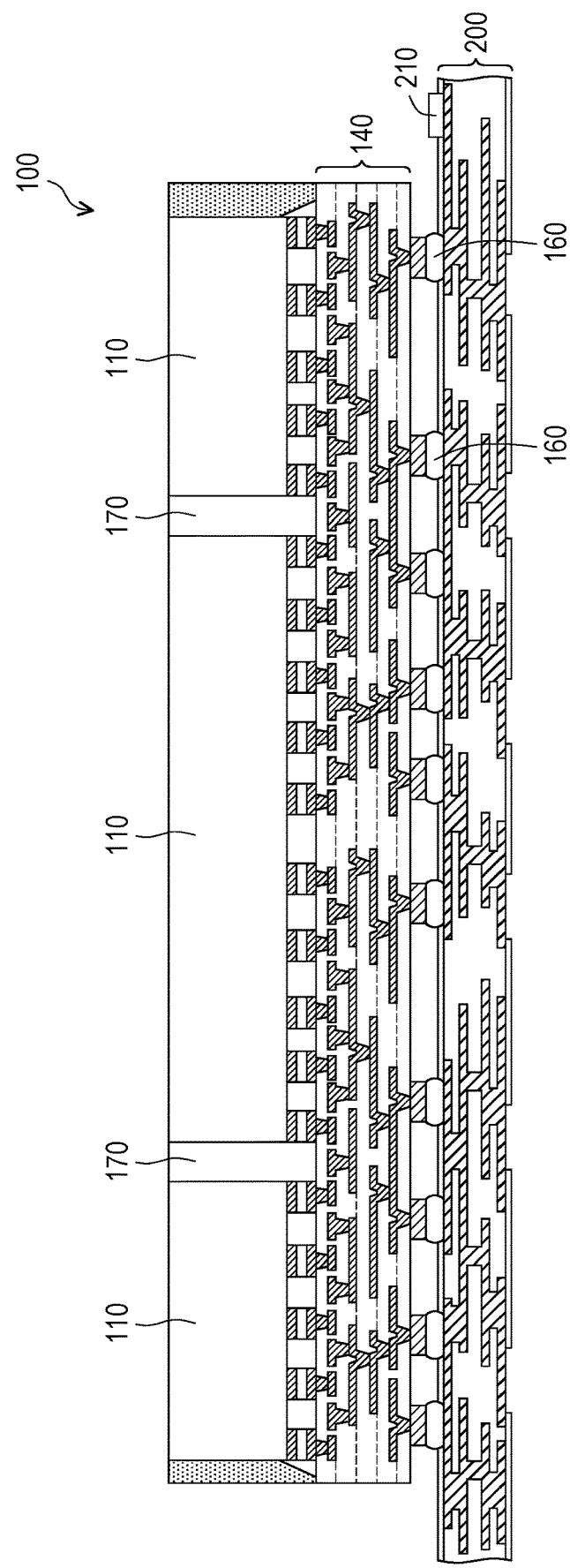

With reference now to FIG. 10, after the package structure 100 is formed, the package structure 100 may be disposed on a substrate 200 through, for example, a pick and place technique. In some embodiments, the connectors 160 are aligned to, and are put against, bond pads of the substrate 200. The connectors 160 may be reflowed to create a bond between the substrate 200 and the package structure 100.

The substrate 200 may include a package substrate, such as a build-up substrate including a core therein, a laminate substrate including a plurality of laminated dielectric films, a PCB, or the like. The substrate 200 may include electrical connectors (not shown), such as solder balls, opposite the component package to allow the substrate 200 to be mounted to another device. In some embodiments, a surface mount device 210 may be directly coupled to the substrate 200. The surface mount device 210 may include one or more passive components such as a capacitor, a resistor, an inductor, the like, or a combination thereof. In an embodiment, the surface mount device 210 consists essentially of one or more passive devices and does not include an active device such as a transistor. In other embodiment, the surface mount device 210 may include an active device. The surface mount device 210 may include a plurality of conductive connectors formed of conductive materials such as solder, the like, or a combination thereof. The surface mount device 210 is electrically coupled to interconnect structure of the substrate 200 through the conductive connectors.

Figure 11:
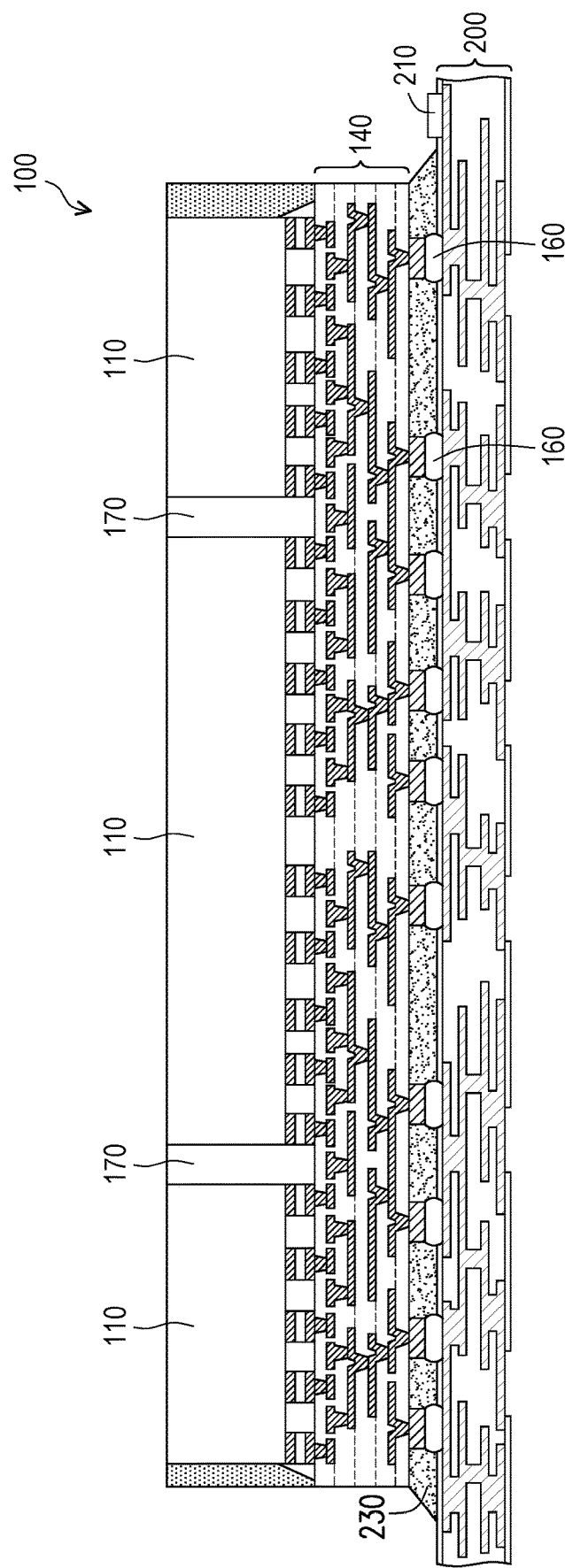

Then, as illustrated in FIG. 11, an underfill material 230 can be dispensed between the package structure 100 and the substrate 200 and surrounding the connectors 160. The underfill material 230 may be any acceptable material, such as a polymer, epoxy, molding underfill, or the like. In some embodiments, the underfill material 230 may be the same material as the filling material 170. In other embodiments, the underfill material 230 may be the different material from the filling material 170.

It is note that, in an alternative embodiment, the package structure 100 may be an Integrated Fan-Out (InFO) package. In other embodiments, the structure of the package structure being mounted on a substrate may be a CoWoS® (Chip on Wafer on Substrate) package. However, the disclosure is not limited thereto. Other suitable packages and component configurations may also be applied.

Figure 12:
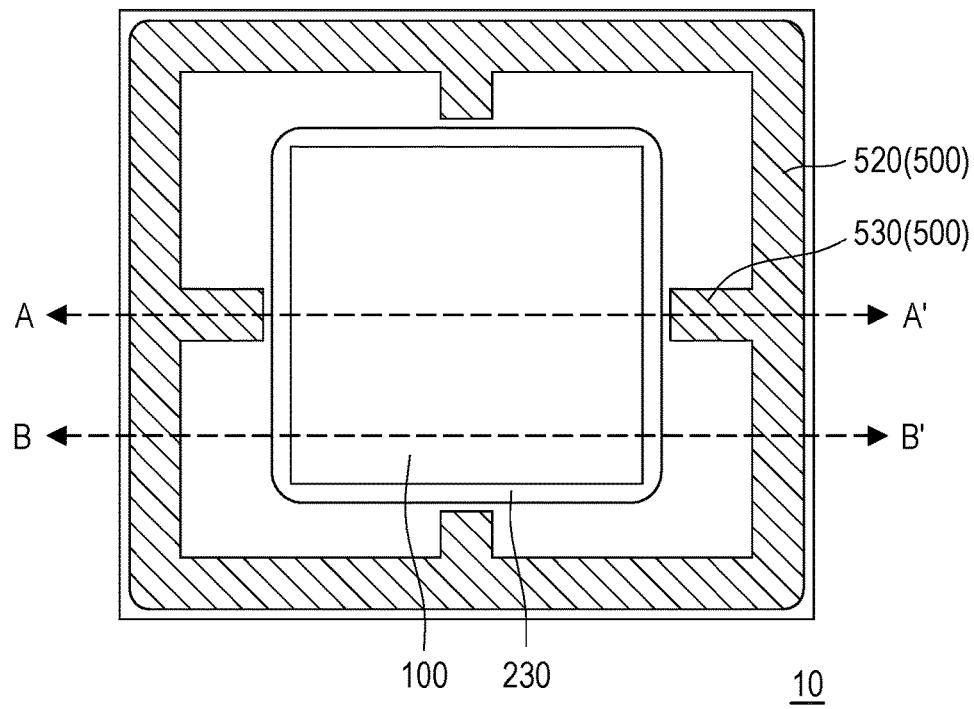
FIG. 12 illustrates a schematic top view of an intermediate stage of a semiconductor package according to some embodiments of the present disclosure.
Figure 13:
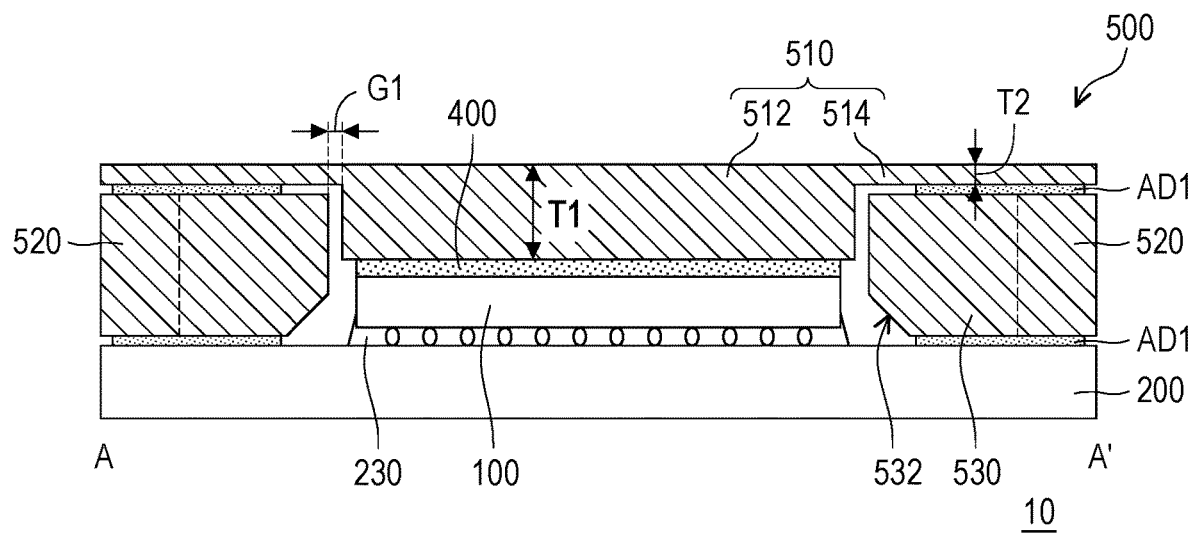
FIG. 13 illustrates a cross sectional view of the semiconductor package in FIG. 12 along line A-A' according to some embodiments of the present disclosure.
Figure 14:
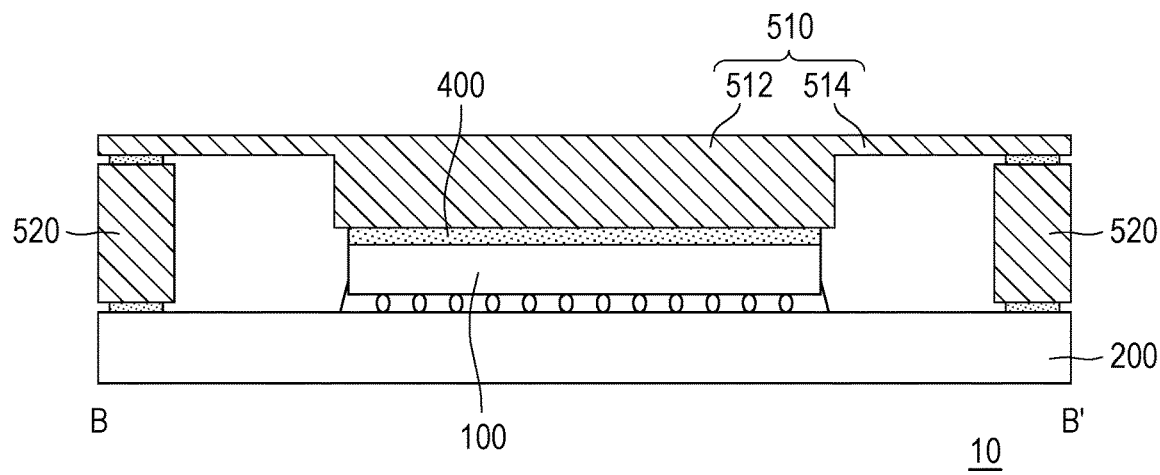
FIG. 14 illustrates a cross sectional view of the semiconductor package in FIG. 12 along line B-B' according to some embodiments of the present disclosure.

FIG. 12 illustrates a schematic top view of an intermediate stage of a semiconductor package according to some embodiments of the present disclosure. FIG. 13 illustrates a cross sectional view of the semiconductor package in FIG. 12 along line A-A' according to some embodiments of the present disclosure. FIG. 14 illustrates a cross sectional view of the semiconductor package in FIG. 12 along line B-B' according to some embodiments of the present disclosure. It is noted that, for better illustrating the structure underneath, a top portion (e.g., cover portion 510 shown in FIG. 13 and FIG. 14) of the lid structure 500 is omitted in top views of the semiconductor packages shown in FIG. 12, FIG. 15, FIG. 16, FIG. 19, FIG. 20, and FIG. 22. Referring to FIG. 12 and FIG. 14, a thermal interface layer 400 may be provided over the package structure 100 to facilitate the heat dissipation of the package structure 100. In some embodiments, the thermal interface layer 400 may include a thermal interface material (TIM). For example, the thermal interface layer 400 includes any suitable thermally conductive material such as a polymer having a good thermal conductivity, which may be between about 3 watts per meter kelvin (W/m·K) to about 5 W/m·K. In some embodiments, the thermal interface layer 400 may include a polymer with thermal conductive fillers. Applicable thermal conductive filler materials may include aluminum oxide, boron nitride, aluminum nitride, aluminum, copper, silver, indium, a combination thereof, or the like. In other embodiments, the thermal interface layer 400 may include other materials such as a metallic-based or solder-based material comprising silver, indium paste, or the like. Although the thermal interface layer 400 is illustrated as a continuous thermal interface layer extending over the package structure 100, in other embodiments, the thermal interface layer 400 may be physically disconnected. In one embodiment, the thermal interface layer 400 may include a metal TIM, which may be in sheet form or in gel form. The composition of the metal TIM may include indium (In), gallium (Ga), tin (Sn), silver (Ag), gold (Au), copper (Cu), bismuth (Bi), zinc (Zn), etc. The disclosure is not limited thereto.

Then, a lid structure 500 is provided over the substrate 200. In some embodiments, the lid structure 500 includes a cover portion 510, a ring portion 520 and a plurality of rib portions 530. The ring portion 520 is disposed over substrate 200 and surrounds the package structure 100 while the cover portion 510 is connected to the ring portion 520 and covers the package structure 100. In some embodiments, the cover portion 510 and the ring portion 520 may be seen as a main body of the lid structure 500 and the rib portions 530 are protruded from the main body (e.g., the ring portion 520 or the cover portion 530) and extended toward the package structure 100. In some embodiments, each of the rib portions 530 may be in a plate form.

In some embodiments, an adhesive AD1 (e.g., an epoxy, silicon resin, or the like) may be dispensed over an otherwise unoccupied portion of the substrate 200. The adhesive AD1 may have a better adhering ability and a lower thermal conductivity than thermal interface layer 400. The adhesive AD1 may be positioned so as to allow a heat dissipating feature (e.g., the lid structure 500) to be attached around the package structure 100. Thus, in some embodiments, adhesive AD1 may be disposed around the perimeter of, or even encircle, the package structure 100.

In some embodiments, the ring portion 520 may be firstly attached to the substrate 200. In a top view of the semiconductor package shown in FIG. 12, the ring portion 520 may encircle the package structure 100. A bottom surface of the ring portion 520 may be adhered to the substrate 200 using the adhesive AD1. The ring portion 520 may have a high thermal conductivity, for example, between about 200 W/m·K to about 400 W/m·K or more, and may be formed using a metal, a metal alloy, stainless steel, or the like. For example, the ring portion 520 may include metals and/or metal alloys such as Al, Cu, Ni, Co, combinations thereof, and the like. The ring portion 520 may also be formed of a composite material, for example silicon carbide, aluminum nitride, graphite, and the like. Another layer of adhesive AD1, which may be substantially similar to adhesive AD1, may be dispensed over a top surface of the ring portion 520.

Then, the cover portion 510 is mounted over the package structure 100 and the ring portion 520. The cover portion 510 may be adhered to the ring portion 520 through adhesive AD1. The cover portion 510 may be formed of substantially similar materials as the ring portion 520, which have a high thermal conductivity, for example, between about 200 W/m·K to about 400 W/m·K or more. In some embodiments, a bottom surface of the cover portion 510 may be in physical contact with the thermal interface layer 400. Accordingly, heat generated by the package structure 100 may not be significantly dissipated and spread through the lid structure 500. In other embodiments, a heat spreader (not shown) may be disposed over the lid structure 500, so the heat generated in the package structure 100 may be conducted away by the heat spreader.

Referring to FIG. 12 and FIG. 13, in some embodiments, the rib portions 530 are integrally formed with the ring portion 520 and extended horizontally toward the package structure 100. That is, there is no interface between the ring portion 520 and the rib portions 530. The rib portions 530 are extended over the substrate 200 toward the package structure 100 to reinforce the mechanical strength of the semiconductor package 10. Accordingly, warpage of the semiconductor package 10 can be improved, so as to enhance mechanical reliability/stability of the semiconductor package 10.

In some embodiments, the rib portions 530 can be arranged in a symmetrical manner around the ring portion 520 for better warpage control and mechanical reliability/stability. In the present embodiment, the rib portions 530 are configured on (extended from) each of inner side surfaces of the ring portion 520, but the disclosure is not limited thereto. In some embodiments, each of the rib portions 530 includes a chamfer 532, which faces the package structure 100 and the substrate 200 so as to keep clearance for the underfill 230 of the semiconductor package 10. In addition, the chamfer 532 may help reducing stress concentration of the package.

In some embodiments, the cover portion 510 includes a package region 512 and a peripheral portion 514 connected to each other. The package region 512 is aligned with the package structure 100 and in contact with the package structure 100 through the thermal interface layer 400. In some embodiments, the thickness T1 of the package region 512 is greater than a thickness T2 of the peripheral portion 514. For example, a ratio of the thickness T1 of the package region 512 to the thickness T2 of the peripheral portion 514 substantially ranged from 1.33 to 6. In particular, the thickness T1 of the package region 512 may range from 2 mm to 3 mm, and the thickness T2 of the peripheral portion 514 may range from 0.5 mm to 1.5 mm. With such arrangement, the package region 512 is in contact with the package structure 100 so the heat generated by the package structure 100 can be conducted away by the lid structure 500, and the peripheral portion 514 with thinner thickness reduces the rigidity of the cover portion 510, so as to improve the flexibility of the cover portion 510 and reduce the issues of stress concentration. In some embodiments, a chamfer may be configured at the interface between the package region 512 and the peripheral portion 514 to further reduce the mechanical strength of the cover portion 510, so as to reduce stress concentration on the thermal interface layer 400, which may cause die crack or delamination. In some embodiments, a gap G1 may exist between the outer side surface of the package region 512 and respective one of the rib portions 530, and the gap G1 may range from 0.5 mm to 1.5 mm.

In some embodiments, the material of the cover portion 510 may be different from the material od the ring portion 520 and the rib portion 530. In one embodiment, for the package requiring higher heat dissipation efficiency, a thermal conductivity of the cover portion 510 is greater than a thermal conductivity of the ring portion 520, so that the cover portion 510 in contact with the package structure 100 can conducted away the heat generated in the package structure 100 much faster. For example, the ring portion 520 may have a high thermal conductivity, for example, between about 200 W/m·K to about 400 W/m·K or more, and may be formed using a metal, a metal alloy, stainless steel, or the like. For example, the ring portion 520 may include metals and/or metal alloys such as Al, Cu, Ni, Co, combinations thereof, and the like. The ring portion 520 may also be formed of a composite material, for example silicon carbide, aluminum nitride, graphite, and the like. On the other hand, a composite material may be utilized in the cover portion 510, in which particles of a satisfactorily thermally conductive material such as diamond and SiC are dispersed in a metal matrix such as Ag, Cu and Al and thus composited therewith. In some embodiments, the composite material of the cover portion 510 may include diamond, Ag/diamond, Cu/diamond, Al/diamond, SiC, Al/SiC, etc. The thermal conductivity of the cover portion 510 may be up to 600 W/(m K) or more. In one embodiment, the thermal conductivity of the cover portion 510 may reach 800 W/(m K) or more. In addition, such composite material of the cover portion 510 provides a lower decrease in thermal conductivity even after high-temperature treatment at 800° C. or cold heat tests.

Figure 15:
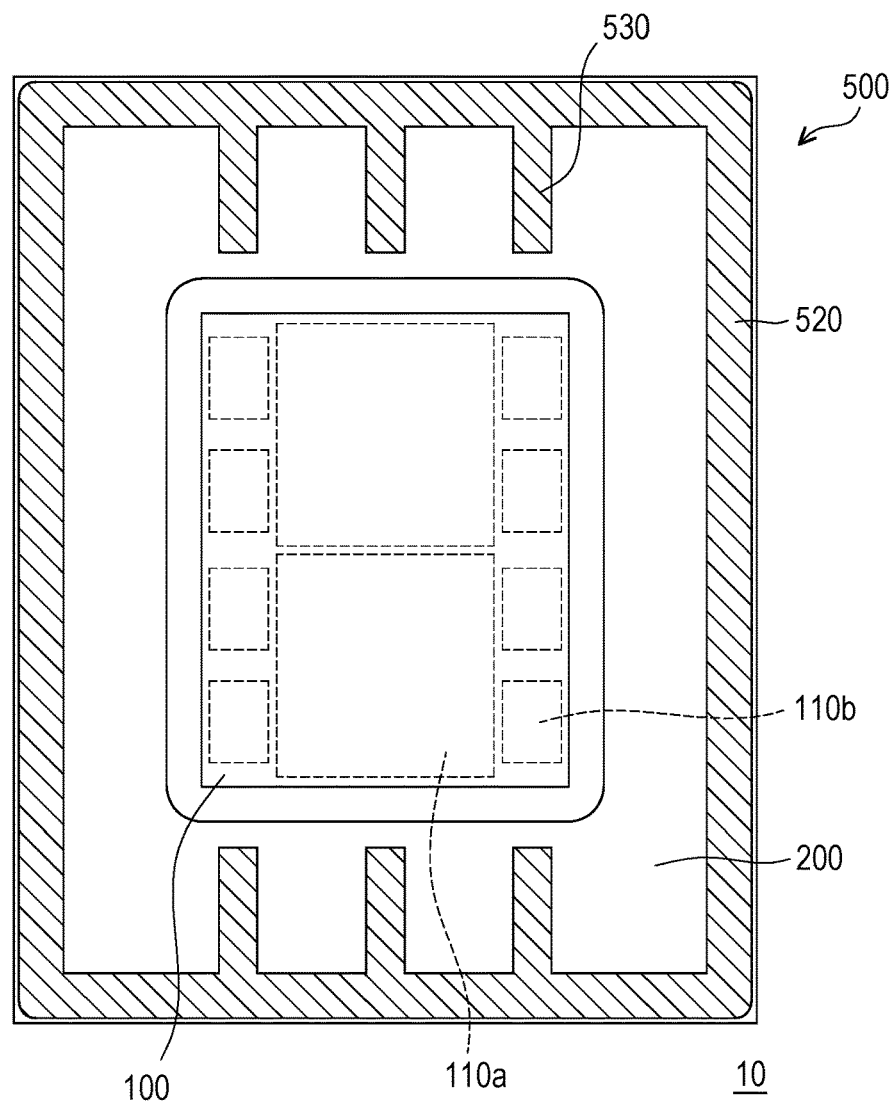
FIG. 15 and FIG. 16 illustrate schematic top views of semiconductor packages according to different embodiments of the present disclosure.
Figure 16:
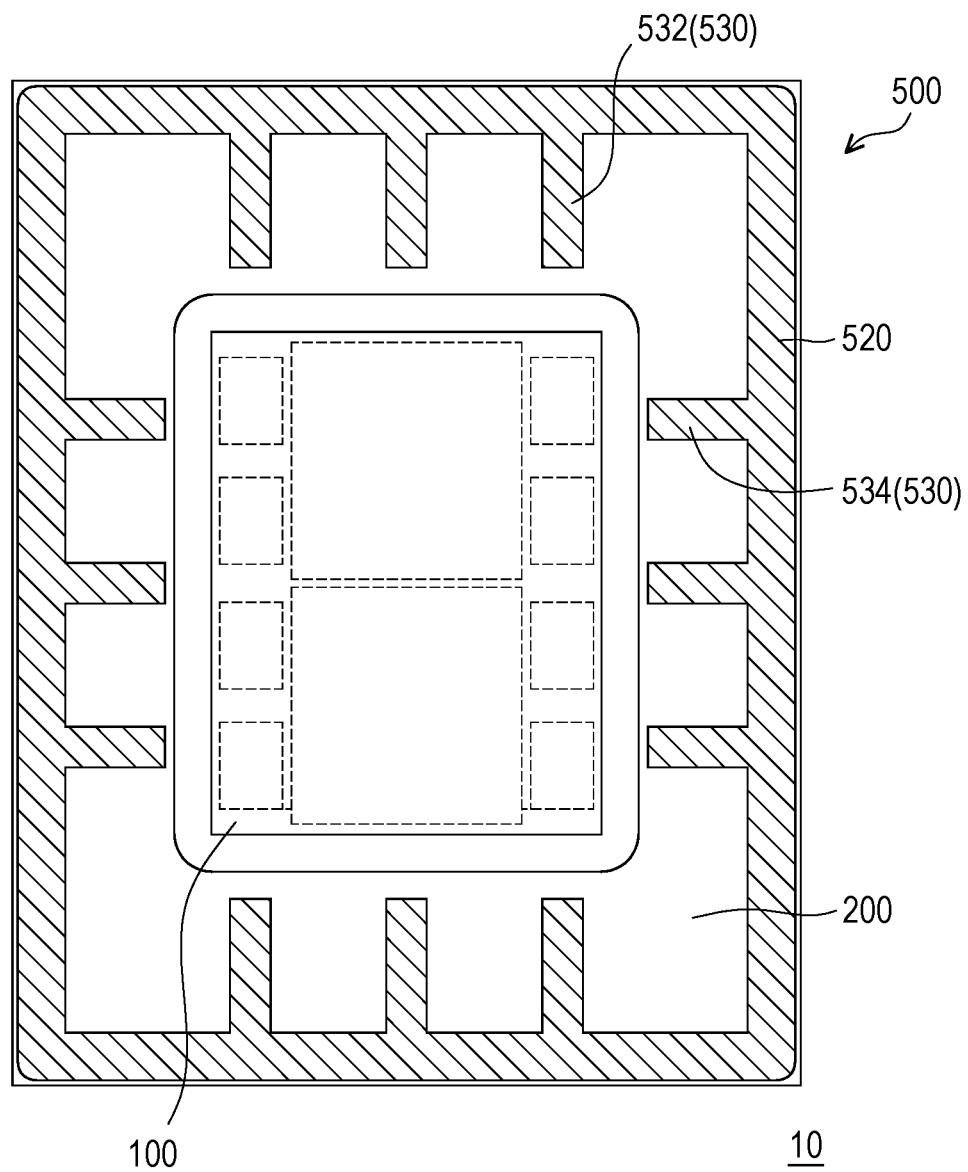

FIG. 15 and FIG. 16 illustrate schematic top views of semiconductor packages according to different embodiments of the present disclosure. It is noted that the semiconductor packages shown in FIG. 15 and FIG. 16 contains many features same as or similar to the semiconductor packages disclosed in the previous embodiments. For purpose of clarity and simplicity, detail description of same or similar features may be omitted, and the same or similar reference numbers denote the same or like components. The main differences between the semiconductor packages shown in FIG. 15 and FIG. 16 and semiconductor packages disclosed in the previous embodiments are described as follows.

In accordance with some embodiments of the disclosure, the layout of the rib portions 530 can be designed according to degree of warpage and/or stress concentration of the semiconductor package. For example, in one embodiment, the package structure 100 may include a plurality of device dies 110a and a plurality of device dies 110b surrounding the device dies 110a. In particular, in the embodiments of FIG. 15 and FIG. 16, the package structure 100 includes 2 device dies 110a arranged in a side-by-side manner at center region of the package structure 100 and 8 device dies 110b arranged symmetrically on two opposite sides of the center region. In some embodiments, the device die 110a may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. On the other hand, the device die 110b may include one or more memory dies, such as a stack of memory dies (e.g., DRAM dies, SRAM dies, High-Bandwidth Memory (HBM) dies, Hybrid Memory Cubes (HMC) dies, or the like). In the embodiments of memory dies stack, each of the device dies (e.g., the second device die 110b and the third device die 110c) can include both memory dies and a memory controller, such as, for example, a stack of four or eight memory dies with a memory controller.

In the embodiment of FIG. 15, the rib portions 530 are extended from the ring portion 520 and extended toward two short sides of the package structure 100. In such embodiment, there is no rib portions 530 extended toward the long sides of the package structure 100. In the embodiment of FIG. 15, the rib portions 530 are extended from the ring portion 520 and extended toward two short sides of the package structure 100. In such embodiment, there is no rib portions 530 extended toward the long sides of the package structure 100, but the disclosure is not limited thereto. In the embodiment of FIG. 16, the rib portions 530 includes first rib portions 532 and second rib portions 534 extended from the inner side surfaces of the ring portion 520. The first rib portions 532 are extended toward the short sides of the package structure 100, and the second rib portions 534 are extended toward the long side of the package structure 100. In some embodiments, the lengths of the first rib portions 532 and the second rib portions 534 may be different. For example, the length of each of the first rib portions 532 is longer than the length of each of the second rib portions 534, but the disclosure is not limited thereto. The lengths of the rib portions may be the same or different from one another. More or less rib portions 530 may be disposed on any parts of the lid structure 500 according to actual needs such as degree of warpage and/or stress concentration of the semiconductor package.

Figure 17:
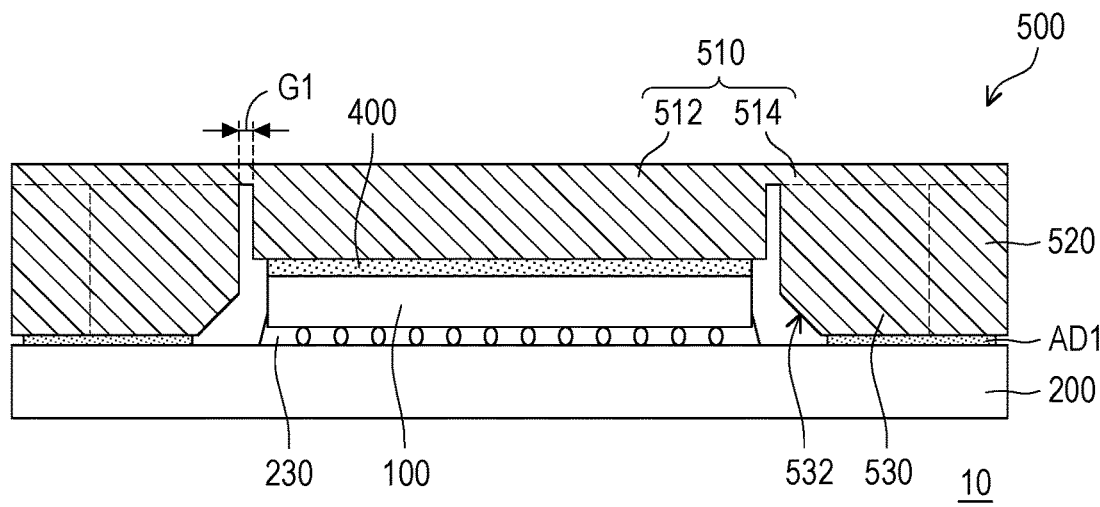
FIG. 17 and FIG. 18 illustrate different cross sectional views of an intermediate stage of a semiconductor package according to some embodiments of the present disclosure.
Figure 18:
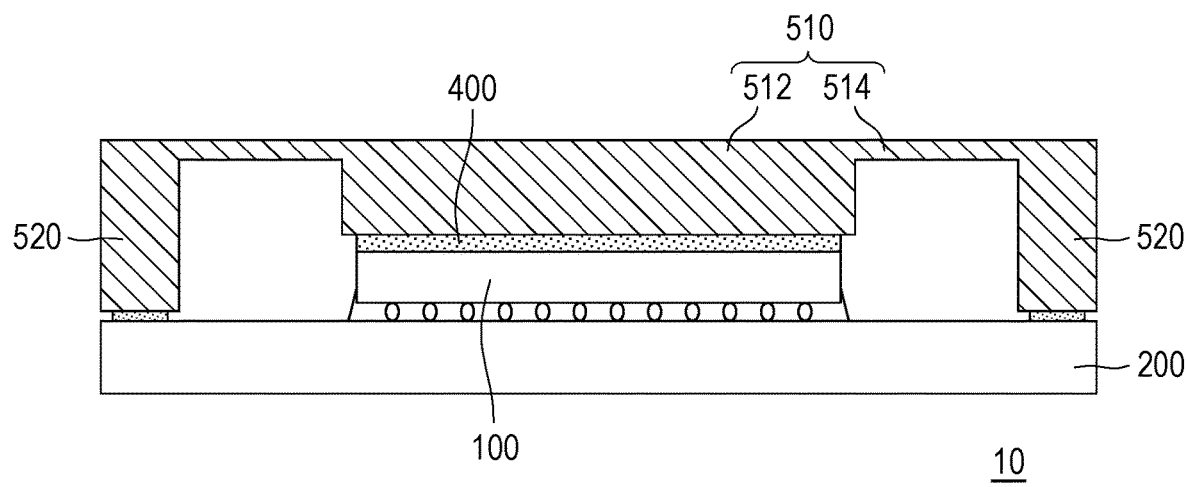

FIG. 17 and FIG. 18 illustrate different cross sectional views of an intermediate stage of a semiconductor package according to some embodiments of the present disclosure. It is noted that the semiconductor packages shown in FIG. 17 and FIG. 18 contains many features same as or similar to the semiconductor packages disclosed in the previous embodiments. For purpose of clarity and simplicity, detail description of same or similar features may be omitted, and the same or similar reference numbers denote the same or like components. The main differences between the semiconductor packages shown in FIG. 17 and FIG. 18 and semiconductor packages disclosed in the previous embodiments are described as follows.

FIG. 17 shows the cross sectional view of the semiconductor package crossing the rib portions 530 (similar to the cross sectional view along A-A' line in FIG. 12), while FIG. 18 shows the cross sectional view of the semiconductor package without crossing the rib portions 530 (similar to the cross sectional view along B-B' line in FIG. 12). With reference now to FIG. 17 and FIG. 18, in some embodiments, the lid structure 500 is integrally formed. That is, the cover portion 510, the ring portion 520 and the rib portions 530 may be a single piece heat dissipation feature. To be more specific, the cover portion 510 is integrally formed with the ring portion 520, and the rib portions are integrally formed with the ring portion 520. In other words, there are no interfaces between the cover portion 510, the ring portion 520 and the rib portions 530, so as to avoid thermal resistance at interfaces and improve heat dissipation efficiency. In some embodiments, the integrally formed lid structure 500 can be formed by metal stamping process, punching process, or the like.

Figure 19:
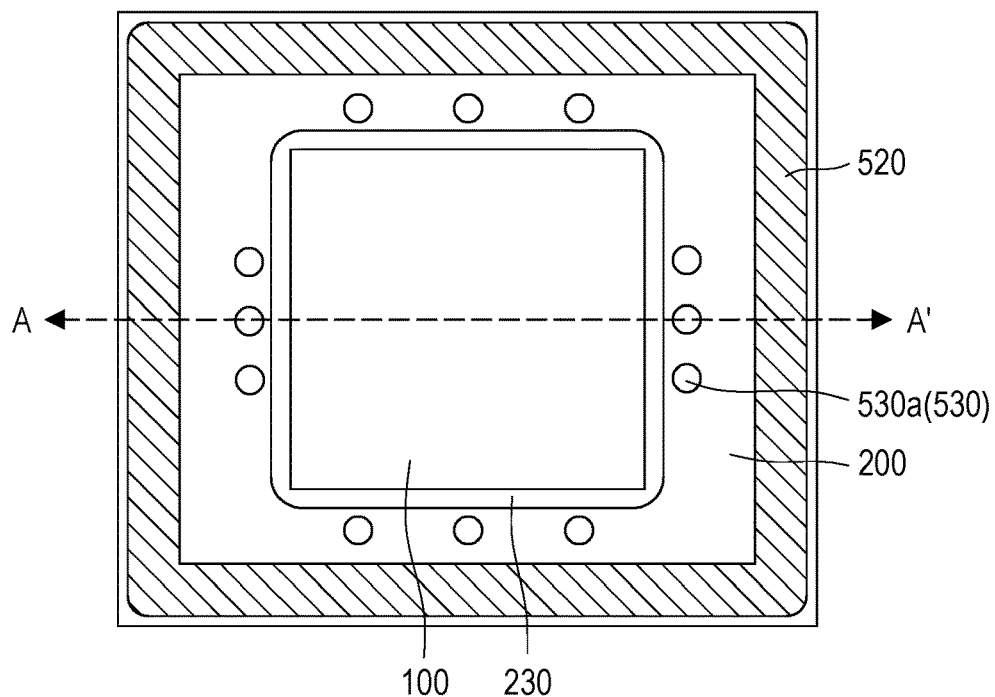
FIG. 19 and FIG. 20 illustrate schematic top views of semiconductor packages according to different embodiments of the present disclosure.
Figure 20:
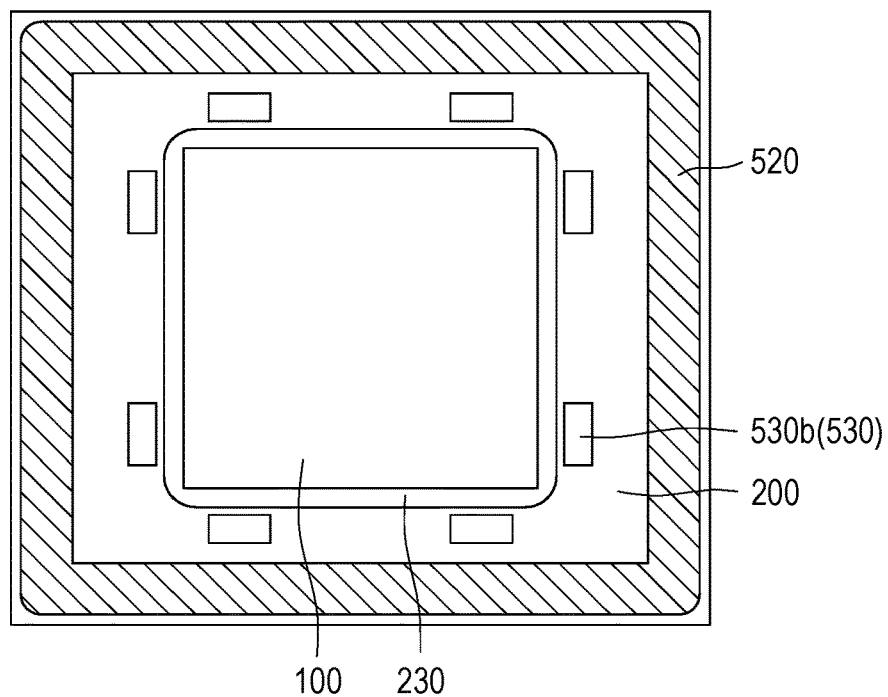
Figure 21:
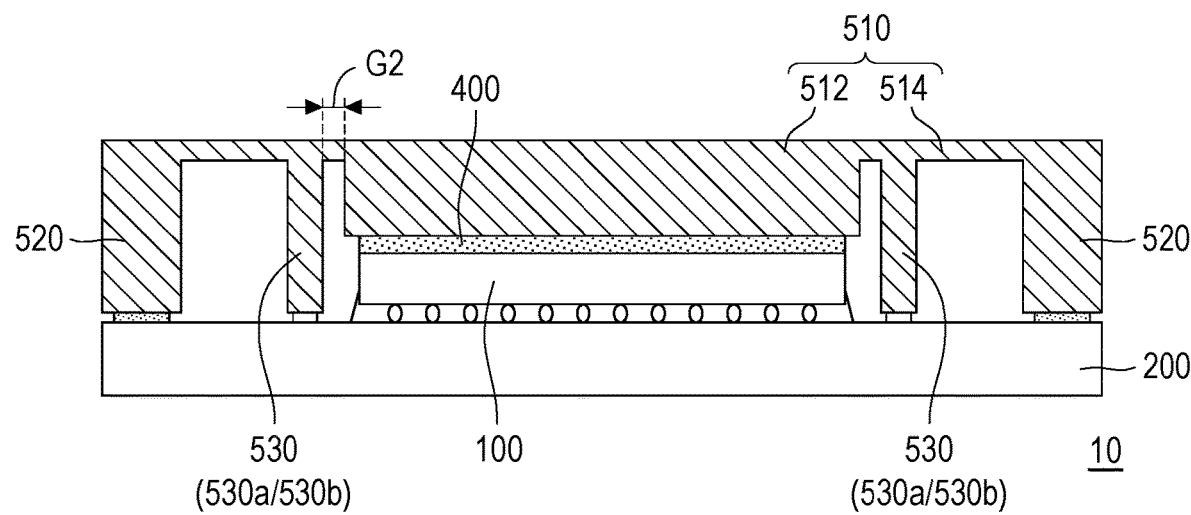
FIG. 21 illustrates a cross sectional view of the semiconductor package in FIG. 19 according to some embodiments of the present disclosure.

FIG. 19 and FIG. 20 illustrate schematic top views of semiconductor packages according to different embodiments of the present disclosure. FIG. 21 illustrates a cross sectional view of the semiconductor package in FIG. 19 according to some embodiments of the present disclosure. It is noted that the semiconductor packages shown in FIG. 19 to FIG. 21 contains many features same as or similar to the semiconductor packages disclosed in the previous embodiments. For purpose of clarity and simplicity, detail description of same or similar features may be omitted, and the same or similar reference numbers denote the same or like components. The main differences between the semiconductor packages shown in FIG. 19 to FIG. 21 and semiconductor packages disclosed in the previous embodiments are described as follows.

With reference to FIG. 19 and FIG. 21, in some embodiments, the rib portions 530 are protruded from the cover portion 510 and extended vertically toward the substrate 200. The rib portions 530 may surround a periphery of the package structure 100 and function as pillars to reinforce the mechanical strength of the package. In some embodiments, a gap G2 may exist between the rib portions 530 and the package structure 100, and the gap G2 may range from 0.5 mm to 1.5 mm. In the embodiment of FIG. 19, a cross section of the rib portions 530a may be in a circular shape. That is, each of the rib portions 530a may be a cylinder. In the embodiment of FIG. 20, a cross section of the rib portions 530a may be in a rectangular shape. That is, each of the rib portions 530b may be a rectangular pillar. The disclosure does not limit the shapes and the layout of the rib portions 530. The layout of the rib portions 530a, 530b is designed according to warpage degree of the semiconductor package.

Figure 22:
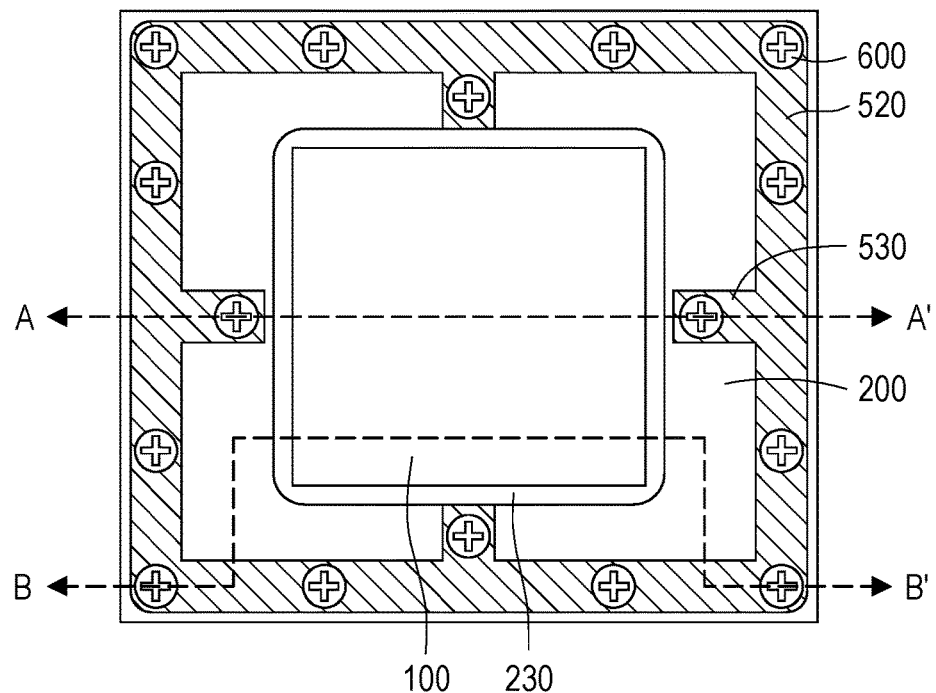
FIG. 22 illustrates a schematic top view of an intermediate stage of a semiconductor package according to some embodiments of the present disclosure.
Figure 23:
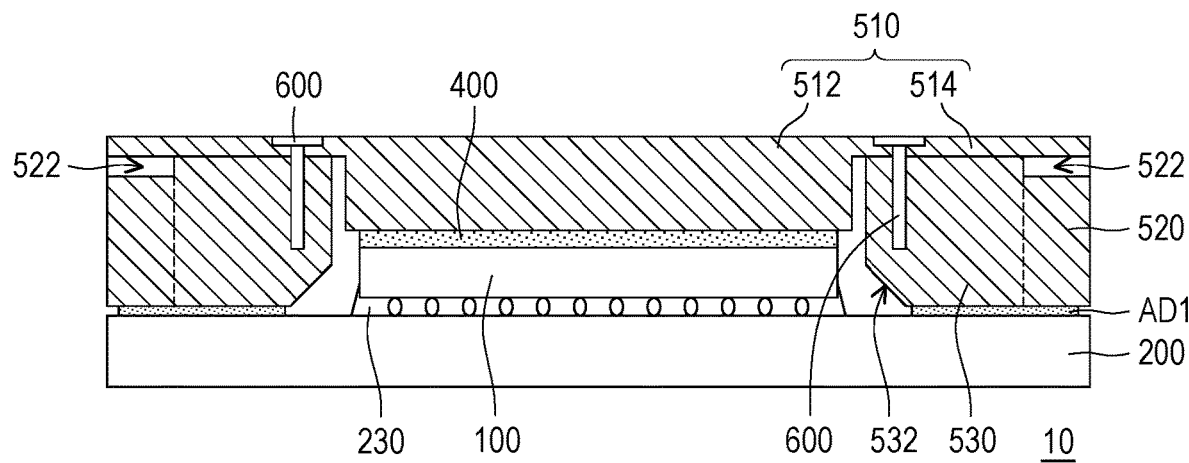
FIG. 23 illustrates a cross sectional view of the semiconductor package in FIG. 22 along line A-A' according to some embodiments of the present disclosure.
Figure 24:
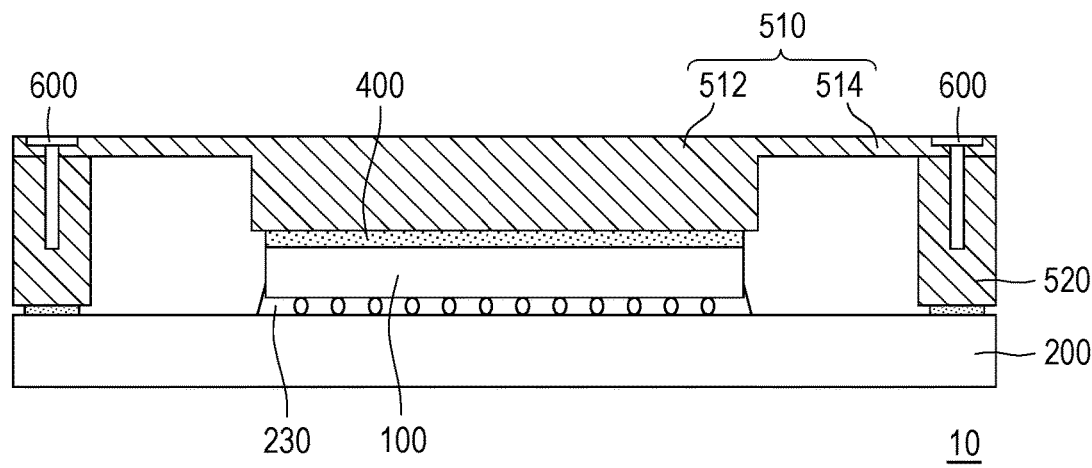
FIG. 24 illustrates a cross sectional view of the semiconductor package in FIG. 22 along line B-B' according to some embodiments of the present disclosure.

FIG. 22 illustrates a schematic top view of an intermediate stage of a semiconductor package according to some embodiments of the present disclosure. FIG. 23 illustrates a cross sectional view of the semiconductor package in FIG. 22 along line A-A' according to some embodiments of the present disclosure. FIG. 24 illustrates a cross sectional view of the semiconductor package in FIG. 22 along line B-B' according to some embodiments of the present disclosure. It is noted that the semiconductor packages shown in FIG. 22 to FIG. 24 contains many features same as or similar to the semiconductor packages disclosed in the previous embodiments. For purpose of clarity and simplicity, detail description of same or similar features may be omitted, and the same or similar reference numbers denote the same or like components. The main differences between the semiconductor packages shown in FIG. 22 to FIG. 24 and semiconductor packages disclosed in the previous embodiments are described as follows.

Referring to FIG. 22 to FIG. 24, in accordance with some embodiments of the disclosure, the lid structure 500 may further include a plurality of fastening components 600 extending through the cover portion 510 for fastening the cover portion 510 to the ring portion 520 and/or the rib portion 530. In some embodiments, the fastening components 600 may be screws, bolts, or the like. The cover portion 510, and the respective ring portion 520 and/or the rib portion 530 may include corresponding threaded holes for the fastening components 600 fastening therein to lock the cover portion 510 onto the ring portion 520 and/or the rib portion 530.

In some embodiments, the process of providing the lid structure 500 over the substrate 200 may include the following steps. Firstly, an adhesive AD1 (e.g., an epoxy, silicon resin, or the like) may be dispensed over an otherwise unoccupied portion of the substrate 200. For example, in some embodiments, adhesive AD1 may be disposed around the perimeter of, or even encircle, the package structure 100. Then, the ring portion 520 along with the rib portion 530 may be bonded to the substrate 200 through the adhesive AD1. The ring portion 520 may encircle the package structure 100, and a bottom surface of the ring portion 520 may be adhered to the substrate 200 using the adhesive AD1. Then, the cover portion 510 may be disposed on the ring portion 520, and the package region 512 of the lid structure 500 is in contact with the package structure 100 through the thermal interface layer 400. In the present embodiment, the ring portion 520 and the rib portions 530 includes a plurality of threaded holes extending from upper surfaces of the ring portion 520 and the rib portions 530, and the cover portion 510 may include a plurality of threaded through holes extending through the cover portion 510. When the cover portion 510 is disposed on the ring portion 520, the threaded through holes on the cover portion 510 are aligned with the threaded holes on the ring portion 520 and the rib portions 530 respectively. The cover portion 510 is then fastened onto the ring portion 520 and/or the rib portions 530 through a plurality of fastening components 600. To be more specific, the fastening components 600 is fastened into the threaded through holes of the cover portion 510 and the threaded through holes of the ring portion 520 and the rib portions 530 to lock the cover portion 510 onto the ring portion 520 and the rib portions 530. In some embodiments, an outer surface of the ring portion 520 may further include a rework cavity 522 for partially exposing a lower surface of the cover portion. With such configuration, when rework or maintenance is needed, an assembly tool, such as a flat screwdriver, can be inserted into the rework cavity 522 to lift the cover portion 510 up. Therefore, the lid structure 500 can be reusable and reworkable.

Figure 25:
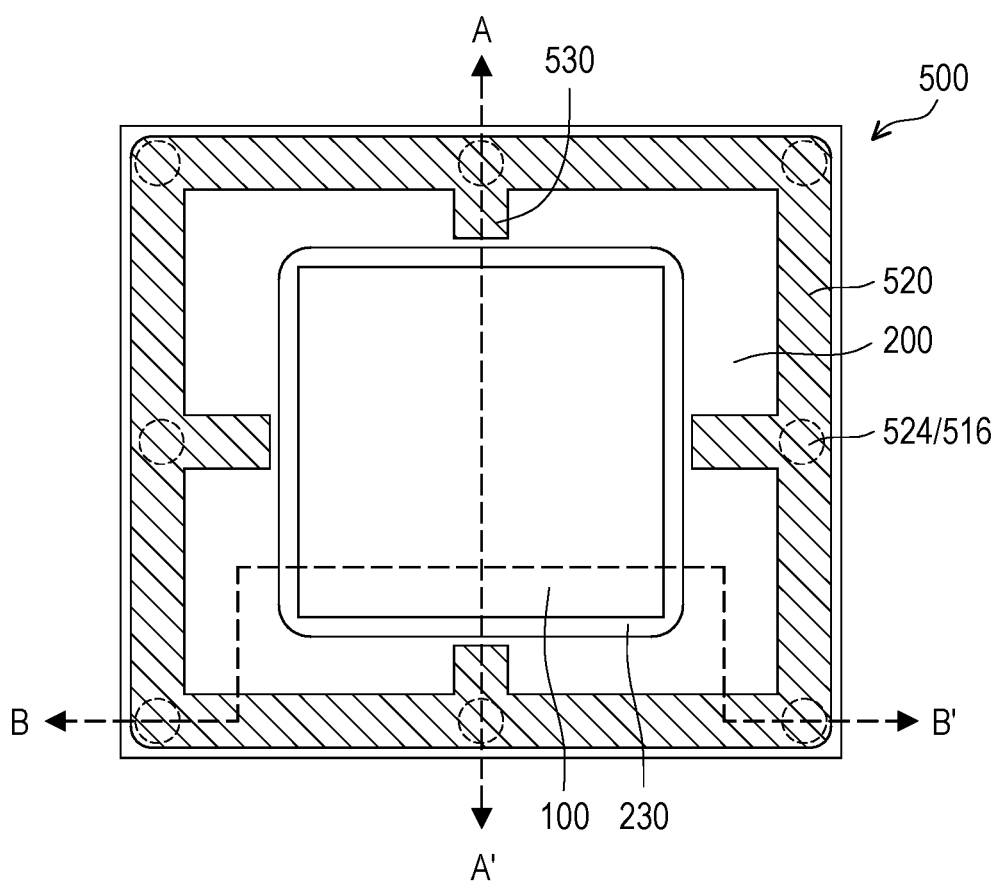
FIG. 25 illustrates a schematic top view of an intermediate stage of a semiconductor package according to some embodiments of the present disclosure.
Figure 26:
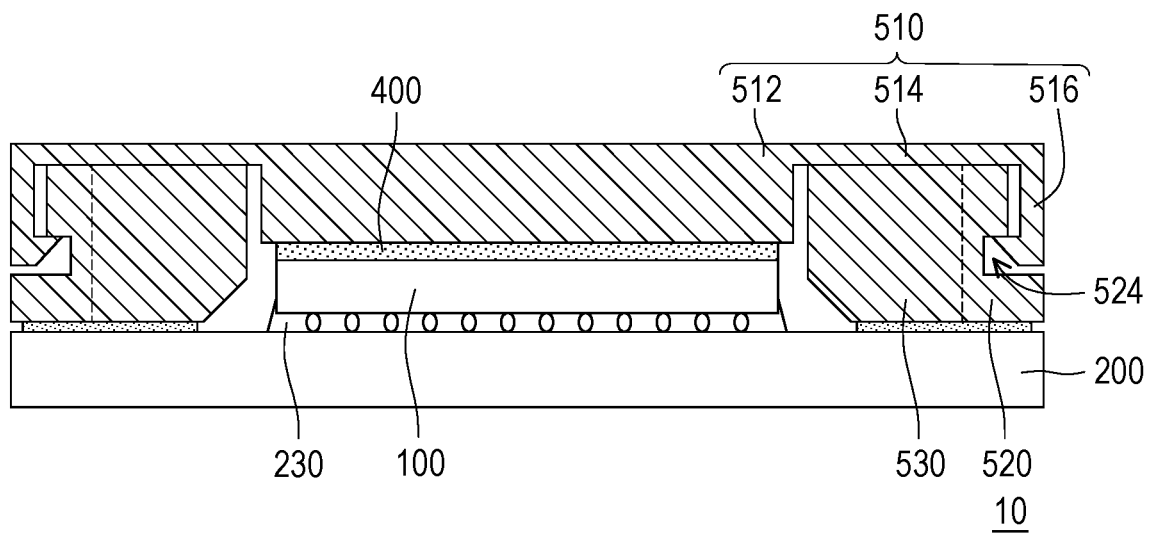
FIG. 26 illustrates a cross sectional view of the semiconductor package in FIG. 25 along line A-A' according to some embodiments of the present disclosure.
Figure 27:
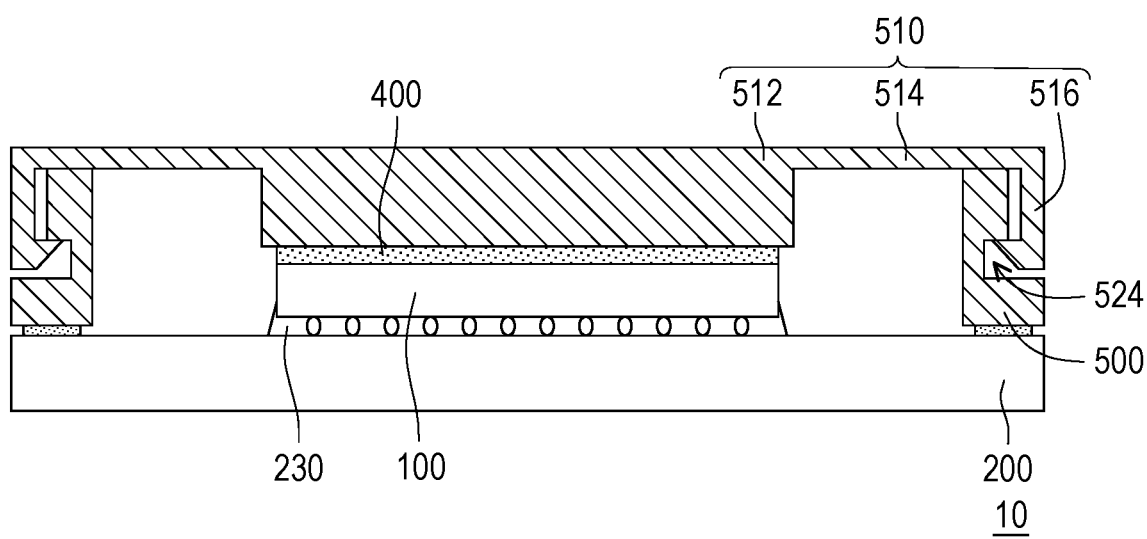
FIG. 27 illustrates a cross sectional view of the semiconductor package in FIG. 25 along line B-B' according to some embodiments of the present disclosure.

FIG. 25 illustrates a schematic top view of an intermediate stage of a semiconductor package according to some embodiments of the present disclosure. FIG. 26 illustrates a cross sectional view of the semiconductor package in FIG. 25 along line A-A' according to some embodiments of the present disclosure. FIG. 27 illustrates a cross sectional view of the semiconductor package in FIG. 25 along line B-B' according to some embodiments of the present disclosure. It is noted that the semiconductor packages shown in FIG. 25 to FIG. 27 contains many features same as or similar to the semiconductor packages disclosed in the previous embodiments. For purpose of clarity and simplicity, detail description of same or similar features may be omitted, and the same or similar reference numbers denote the same or like components. The main differences between the semiconductor packages shown in FIG. 25 to FIG. 27 and semiconductor packages disclosed in the previous embodiments are described as follows.

Referring to FIG. 25 to FIG. 27, in some embodiments, the cover portion 510 includes a plurality of cover engaging parts 516, and the ring portion 520 includes a plurality of ring engaging parts 524 engaged with the cover engaging parts 516 respectively. In some embodiments, the cover engaging parts 524 may be integrally formed with the ring portion 520, and the ring engaging parts 524 may be integrally formed with the ring portion 520. In the present embodiment, for example, the ring engaging parts 524 may include a positioning groove, and the cover engaging parts 516 may include a positioning hook for being engaged with the positioning groove. However, the disclosure is not limited thereto. The ring engaging parts 524 and the cover engaging parts 516 may be in any suitable forms as long as they can engaged with one another without help from other fastening or locking components. In some embodiments, the rib portions 530 may also include corresponding engaging parts for being engaged with the cover engaging parts of the cover portion 510.

In some embodiments, the process of providing the lid structure 500 over the substrate 200 may include the following steps. Firstly, an adhesive AD1 (e.g., an epoxy, silicon resin, or the like) may be dispensed over an otherwise unoccupied portion of the substrate 200. For example, in some embodiments, adhesive AD1 may be disposed around the perimeter of, or even encircle, the package structure 100. Then, the ring portion 520 along with the rib portion 530 may be bonded to the substrate 200 through the adhesive AD1. The ring portion 520 may encircle the package structure 100, and a bottom surface of the ring portion 520 may be adhered to the substrate 200 using the adhesive AD1. Then, the cover portion 510 may be disposed on the ring portion 520, and the package region 512 of the lid structure 500 is in contact with the package structure 100 through the thermal interface layer 400. The cover portion 510 is locked with the ring portion 520 by engaging the cover engaging parts 516 of the cover portion 510 with the ring engaging parts 524 of the ring portion 520. For the present embodiment, the cover portion 510 can be pressed for the positioning hook of the cover portion 510 to be engaged with the positioning groove of the ring portion 520. Accordingly, the lid structure 500 can be reusable and reworkable without help from other fastening or locking components.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a substrate, a package structure, and a lid structure. The package structure is disposed on the substrate. The lid structure is disposed over substrate, wherein the lid structure includes a main body covering and surrounding the package structure and a plurality of rib portions protruded from the main body and extended toward the package structure. In an embodiment, the lid structure is integrally formed. In an embodiment, the plurality of rib portions are extended horizontally toward the package structure. In an embodiment, the plurality of rib portions extended vertically toward the substrate. In an embodiment, the main body further comprising a cover portion covering the package structure and a ring portion disposed over substrate and surrounding the package structure. In an embodiment, the cover portion comprises a package region aligned with the package structure and a peripheral portion surrounding the package region and connected to the ring portion, and a thickness of the package region is greater than a thickness of the peripheral portion. In an embodiment, each of the plurality of rib portions comprises a chamfer facing the package structure and the substrate. In an embodiment, the package structure comprises a plurality of device dies and a filling material filling a gap between adjacent two of the plurality of device dies.

In accordance with some embodiments of the disclosure, a semiconductor package includes a substrate, a package structure, and a lid structure. The package structure is disposed on the substrate. The lid structure includes a cover portion, a ring portion, and a plurality of rib portions. The cover portion covers the package structure. The ring portion is disposed over substrate and surrounds the package structure. The rib portions are protruded from the ring portion or the cover portion and extended toward the package structure. In an embodiment, the plurality of rib portions are protruded from the ring portion and extended horizontally toward the package structure. In an embodiment, the plurality of rib portions are protruded from the cover portion and extended vertically toward the substrate. In an embodiment, the cover portion comprises a package region aligned with the package structure and a peripheral portion surrounding the package region and connected to the ring portion, and a thickness of the package region is greater than a thickness of the peripheral portion. In an embodiment, the lid structure is integrally formed. In an embodiment, the lid structure further comprises a plurality of fastening components extending through the cover portion for fastening the cover portion to the ring portion. In an embodiment, the cover portion comprises a plurality of cover engaging parts, and the ring portion comprises a plurality of ring engaging parts engaged with the plurality of cover engaging parts respectively. In an embodiment, a thermal conductivity of the cover portion is greater than a thermal conductivity of the ring portion.

In accordance with some embodiments of the disclosure, a manufacturing method of a semiconductor package includes the following steps. A package structure is provided over a substrate. A thermal interface layer is provided over the package structure. A lid structure is provided over the substrate, wherein the lid structure includes a main body in contact with the package structure through the thermal interface layer and surrounding the package structure and a plurality of rib portions protruded from the main body and extended toward the package structure. In an embodiment, the main body further comprising a cover portion covering the package structure and a ring portion disposed over substrate and surrounding the package structure. In an embodiment, providing the lid structure over the substrate further includes: bonding the ring portion onto the substrate; and fastening the cover portion onto the ring portion through a plurality of fastening components. In an embodiment, providing the lid structure over the substrate further includes: bonding the ring portion onto the substrate; and engaging a plurality of cover engaging parts of the cover portion with a plurality of ring engaging parts of the ring portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a substrate;
   a package structure disposed on the substrate; and
   a lid structure disposed over substrate, wherein the lid structure comprises a main body covering and surrounding the package structure and a plurality of rib portions protruded from the main body and extended toward the package structure, wherein the plurality of rib portions are bonded to the substrate through an adhesive.

2. The semiconductor package as claimed in claim 1, wherein the lid structure is integrally formed.

3. The semiconductor package as claimed in claim 1, wherein the plurality of rib portions are extended horizontally toward the package structure.

4. The semiconductor package as claimed in claim 1, wherein the plurality of rib portions extended vertically toward the substrate.

5. The semiconductor package as claimed in claim 1, wherein the main body further comprising a cover portion covering the package structure and a ring portion disposed over substrate and surrounding the package structure.

6. The semiconductor package as claimed in claim 5, wherein the cover portion comprises a package region aligned with the package structure and a peripheral portion surrounding the package region and connected to the ring portion, and a thickness of the package region is greater than a thickness of the peripheral portion.

7. The semiconductor package as claimed in claim 1, wherein each of the plurality of rib portions comprises a chamfer facing the package structure and the substrate.

8. The semiconductor package as claimed in claim 1, wherein the package structure comprises a plurality of device dies and a filling material filling a gap between adjacent two of the plurality of device dies.

9. A semiconductor package, comprising:
   a substrate;
   a package structure disposed on the substrate; and
   a lid structure comprising:
     a cover portion covering the package structure;
     a ring portion disposed over substrate and surrounding the package structure; and
     a plurality of rib portions protruded from the ring portion or the cover portion and extended toward the package structure, wherein the plurality of rib portions and the ring portion are bonded to the substrate through an adhesive.

10. The semiconductor package as claimed in claim 9, wherein the plurality of rib portions are protruded from the ring portion and extended horizontally toward the package structure.

11. The semiconductor package as claimed in claim 9, wherein the plurality of rib portions are protruded from the cover portion and extended vertically toward the substrate.

12. The semiconductor package as claimed in claim 9, wherein the cover portion comprises a package region aligned with the package structure and a peripheral portion surrounding the package region and connected to the ring portion, and a thickness of the package region is greater than a thickness of the peripheral portion.

13. The semiconductor package as claimed in claim 9, wherein the lid structure is integrally formed.

14. The semiconductor package as claimed in claim 9, wherein the lid structure further comprises a plurality of fastening components extending through the cover portion for fastening the cover portion to the ring portion.

15. The semiconductor package as claimed in claim 9, wherein the cover portion comprises a plurality of cover engaging parts, and the ring portion comprises a plurality of ring engaging parts engaged with the plurality of cover engaging parts respectively.

16. The semiconductor package as claimed in claim 9, wherein a thermal conductivity of the cover portion is greater than a thermal conductivity of the ring portion.

17. A semiconductor package, comprising:
   a substrate;
   a package structure disposed on the substrate; and
   a lid structure disposed over the substrate and covering the package structure, wherein the lid structure is attached to an upper surface of the package structure and comprises a plurality of rib portions protruded from side walls of the lid structure, and the plurality of rib portions are attached to the substrate through an adhesive.

18. The semiconductor package as claimed in claim 17, wherein the lid structure further comprises a cover portion attached to the upper surface of the package structure and a ring portion attached to substrate and surrounding the package structure.

19. The semiconductor package as claimed in claim 18, wherein the plurality of rib portions disposed on the ring portion and extended horizontally toward the package structure.

20. The semiconductor package as claimed in claim 18, wherein the plurality of rib portions disposed on the cover portion and extended vertically toward the substrate.

* * * * *